United States Patent
Kim et al.

(10) Patent No.: US 10,091,876 B2
(45) Date of Patent: Oct. 2, 2018

(54) PRINTED CIRCUIT BOARD AND DISPLAY DEVICE INCLUDING THE SAME

(71) Applicant: Samsung Display Co., Ltd., Yongin-si (KR)

(72) Inventors: Byoung Yong Kim, Seoul (KR); Jeong Ho Hwang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/679,095

(22) Filed: Aug. 16, 2017

(65) Prior Publication Data

US 2018/0063954 A1    Mar. 1, 2018

(30) Foreign Application Priority Data

Aug. 30, 2016    (KR) .......... 10-2016-0110938

(51) Int. Cl.
| | |
|---|---|
| H05K 7/10 | (2006.01) |
| H05K 7/12 | (2006.01) |
| H05K 1/11 | (2006.01) |
| H01L 27/12 | (2006.01) |
| H05K 1/18 | (2006.01) |

(Continued)

(52) U.S. Cl.
CPC ............ *H05K 1/111* (2013.01); *H01L 27/124* (2013.01); *H01L 27/1248* (2013.01); *H05K 1/0268* (2013.01); *H05K 1/18* (2013.01); *G02F 1/13452* (2013.01); *G02F 1/13458* (2013.01); *G02F 1/136286* (2013.01); *H01L 27/3276* (2013.01); *H01L 51/0096* (2013.01); *H05K 2201/094* (2013.01); *H05K 2201/09381* (2013.01); *H05K 2201/09781* (2013.01); *H05K 2201/10128* (2013.01); *H05K 2201/10136* (2013.01)

(58) Field of Classification Search
USPC .................................................. 461/768, 767
See application file for complete search history.

(56) References Cited

U.S. PATENT DOCUMENTS

| | | |
|---|---|---|
| 8,853,694 B2 | 10/2014 | Han et al. |
| 9,312,251 B2 | 4/2016 | Huang |

(Continued)

FOREIGN PATENT DOCUMENTS

| | | |
|---|---|---|
| KR | 10-0947967 | 3/2010 |
| KR | 10-2014-0067762 | 6/2014 |
| KR | 10-1633373 | 6/2016 |

*Primary Examiner* — Andargie M Aychillhum
(74) *Attorney, Agent, or Firm* — H.C. Park & Associates, PLC

(57) ABSTRACT

A display device including: a display substrate including a display area configured to display an image and a pad area positioned on the periphery of the display area; a first pad part positioned above the pad area and including first pad terminals arranged in a first direction; and a printed circuit board including a base film and a second pad part positioned at one side of the base film and coupled with the first pad part, the second pad part includes first contact terminals coupled with first pad terminals, each of first contact terminals includes first contact pad terminals arranged along a first row forming a first inclination angle with the first direction, and second contact pad terminals spaced from first contact pad terminals and arranged along a second row forming a second inclination angle with the first direction.

26 Claims, 15 Drawing Sheets

(51) Int. Cl.
    *H05K 1/02*     (2006.01)
    *H01L 27/32*     (2006.01)
    *H01L 51/00*     (2006.01)
    *G02F 1/1362*     (2006.01)
    *G02F 1/1345*     (2006.01)

(56) References Cited

U.S. PATENT DOCUMENTS

| | | | |
|---|---|---|---|
| 2002/0047133 A1* | 4/2002 | Nakahara | H01L 23/4985 257/124 |
| 2009/0231823 A1* | 9/2009 | Kunimatsu | H05K 1/111 361/783 |
| 2016/0033805 A1 | 2/2016 | Han | |
| 2016/0048619 A1 | 2/2016 | Dalton | |
| 2016/0055777 A1 | 2/2016 | Kim | |

\* cited by examiner

D1 = D2

PRINTED CIRCUIT BOARD AND DISPLAY DEVICE INCLUDING THE SAME

CROSS-REFERENCE TO RELATED APPLICATION

This application claims priority from and the benefit of Korean Patent Application No. 10-2016-0110938, filed on Aug. 30, 2016, which is hereby incorporated by reference for all purposes as if fully set forth herein.

BACKGROUND

Field

Exemplary embodiments relate to a printed circuit board and a display device including the same.

Discussion of the Background

Display devices which are currently known include a liquid crystal display (LCD), a plasma display panel (PDP), an organic light emitting diode (OLED) device, a field emission display (FED), an electrophoretic display device, and the like.

In particular, the OLED device includes two electrodes and an organic emission layer interposed therebetween and electrons injected from one electrode and holes injected from the other electrode are coupled in the organic emission layer to form exciton and the exciton emits light while emitting energy.

The OLED device has a self-luminance characteristic and does not require a separate light source unlike the LCD, and as a result, a thickness and a weight of the OLED device can be reduced. Further, since the OLED device shows high-grade characteristics including low power consumption, high luminance, and a high response speed, the OLED device has attracted public attention as a next-generation display device.

A printed circuit board is coupled to a peripheral area of a display substrate in order to drive an OLED of the OLED device and the display substrate receives a signal required for the driving through the printed circuit board.

In this case, in order to receive an accurate signal through the printed circuit board, a pad terminal of the printed circuit board and the pad terminal of the display substrate need to be accurately aligned and disposed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device and a printed circuit board which can uniformly maintain a contact area of a pad terminal of the printed circuit board and the pad terminal of a display substrate. Exemplary embodiments provide a display substrate including a display area configured to display an image and a pad area positioned on a periphery of the display area; a first pad part positioned above the pad area and including a plurality of first pad terminals arranged in a first direction; and a printed circuit board including a base film and a second pad part positioned at one side of the base film and coupled with the first pad part; the second pad part comprises a plurality of first contact terminals coupled with the plurality of first pad terminals, each of the plurality of first contact terminals further includes: a plurality of first contact pad terminals arranged along a first row forming a first inclination angle with the first direction, and a plurality of second contact pad terminals spaced apart from the plurality of first contact pad terminals and arranged along a second row forming a second inclination angle with the first direction, and each of the plurality of first contact pad terminal has a first area and each of the plurality of second contact pad terminal has a second area that is different from the first area.

Additional aspects will be set forth in the detailed description which follows, and, in part, will be apparent from the disclosure, or may be learned by practice of the inventive concept. The printed circuit board may further include a first terminal line disposed on the base film, and the first terminal line is electrically connected with the plurality of first contact pad terminals disposed below the base film through the base film, the first terminal line, the plurality of first contact pad terminals coupled with the base film defines a first contact hole penetrating the base film.

The first contact hole may overlap with the plurality of first contact pad terminals.

The first areas of the plurality of first contact pad terminals may be larger than the second areas of the plurality of second contact pad terminals.

A ratio of the first area to the second area may be 1:1.06 or more.

The printed circuit board may further include a plurality of first test lines which is connected to the first terminal line and extends up to one end of the base film.

Each of the plurality of first contact pad terminals may have a quadrangular shape. each of the plurality of first contact pad terminals further comprises a first side parallel to the first direction and a second side neighboring to the first side and parallel to a second direction crossing the first direction, and a length of the second side is greater than or equal to (≥) a length of the first side.

The first inclination angle and the second inclination angle may be the same as each other.

The first inclination angle and the second inclination angle may be larger than 0° and smaller than 90°.

Each of the plurality of first pad terminals may include a plurality of first connection pad terminals respectively facing the plurality of first contact pad terminals, and arranged along the first row, and a plurality of second connection pad terminals respectively facing the plurality of second contact pad terminals, and arranged along the second row.

The first areas of the plurality of first contact pad terminals may be larger than the second areas of the plurality of second contact pad terminals.

Each of the plurality of first pad terminals may further include a plurality of first terminal connection lines connecting one of the plurality of first connection pad terminals and one of the second connection pad terminals and having a shape in which the first terminal connection lines are bent once or more.

Each of the plurality of first pad terminals may further include a first dummy pad terminal disposed between one pair of adjacent first connection pad terminals among the plurality of first connection pad terminals along the first row.

Each of the plurality of first pad terminals may further include a second dummy pad terminal disposed between one pair of adjacent second connection pad terminals among the plurality of second connection pad terminals along the second row.

The first pad part may further include a plurality of second pad terminals disposed in a second terminal area spaced apart from a first terminal area where the plurality of first pad terminals is disposed.

Each of the plurality of second pad terminals may further include a plurality of third connection pad terminals arranged along a third row having the third inclination angle with the first direction, and a plurality of fourth connection pad terminals spaced apart from the plurality of third connection pad terminals and arranged along a fourth row having a fourth inclination angle with the first direction.

The second pad part of the printed circuit board may further include a plurality of second contact terminals disposed in a fourth terminal area spaced apart from a third terminal area where the plurality of first contact terminals is disposed.

Each of the plurality of second contact terminals may include a plurality of third contact pad terminals respectively facing the plurality of third connection pad terminals, and arranged along the third row, and a plurality of fourth contact pad terminals respectively facing the plurality of fourth connection pad terminals, and arranged along the fourth row.

According to exemplary embodiments, a printed circuit board including: a base film; a second pad part positioned below the base film and including a plurality of first contact terminals arranged in a first direction; and a first terminal line disposed on the base film, wherein each of the plurality of first contact terminals includes a plurality of first contact pad terminals arranged along a first row forming a first inclination angle with the first direction, the plurality of first contact pad terminals are electrically connected with the first terminal line through the base film, wherein the first terminal line, the plurality of first contact pad terminals coupled with the base film defines a first contact hole penetrating the base film, and the plurality of first contact pad terminals overlap with the first contact hole, and a plurality of second contact pad terminals spaced apart from the plurality of first contact pad terminals and arranged along a second row having a second inclination angle with the first direction, and the plurality of first contact pad terminals and the plurality of second contact pad terminals have different areas.

The first areas of the plurality of first contact pad terminals may be larger than the second areas of the plurality of second contact pad terminals.

The printed circuit board may further include a plurality of first test lines which is connected to the first terminal line and extends up to one end of the base film.

Each of the plurality of first contact pad terminals may have a quadrangular shape.

Each of the plurality of first contact pad terminals may further include a first side parallel to the first direction and a second side neighboring to the first side and parallel to a second direction crossing the first direction, and the length of the second side may be greater than or equal to (≥) the length of the first side.

According to exemplary embodiments, a contact area of a pad terminal of the printed circuit board and the pad terminal of a display substrate can be uniformly maintained.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
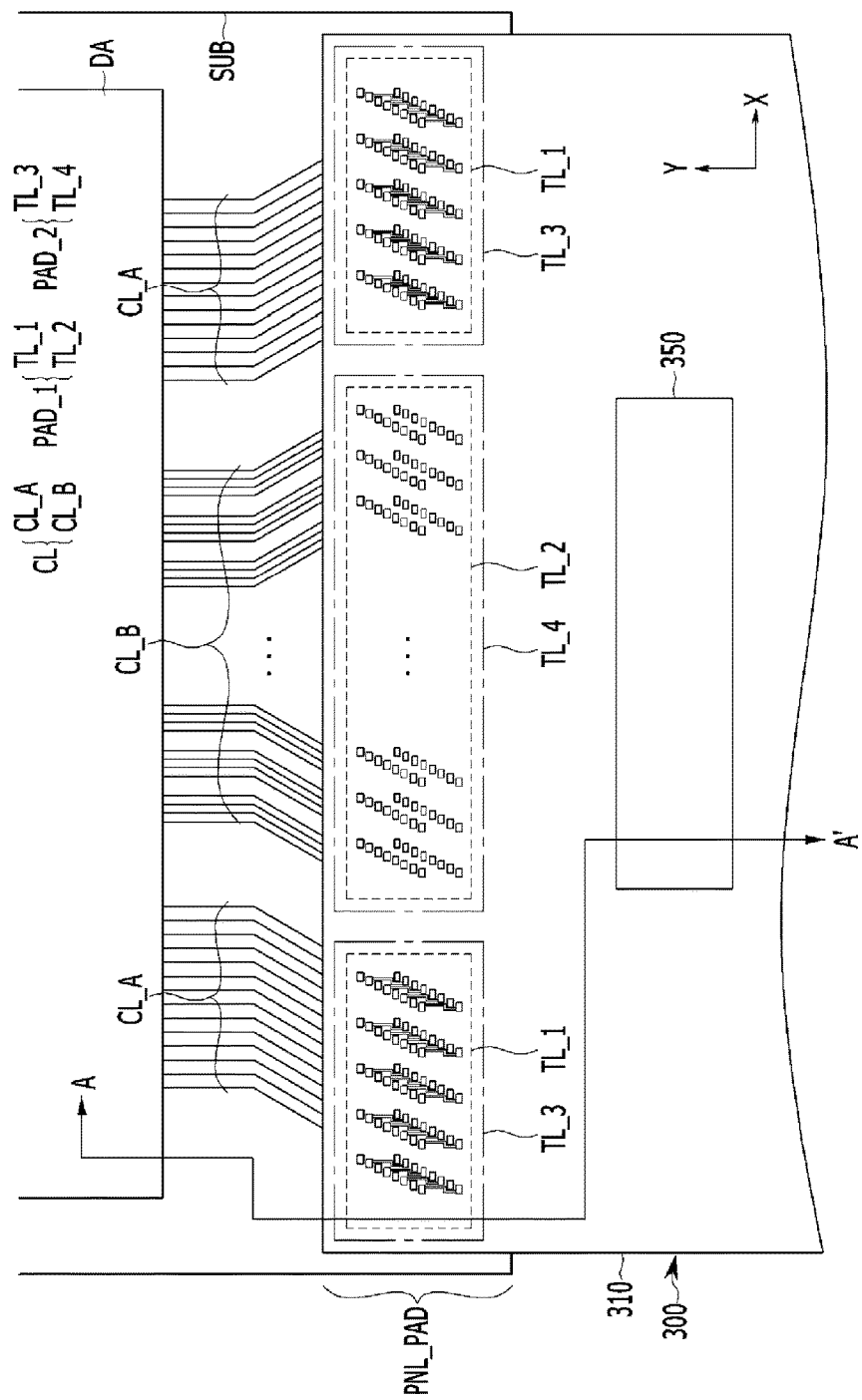
FIG. 1 is a schematic plan view of a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first", "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, a display device according to an exemplary embodiment will be described with reference to FIGS. 1 and 2.

Figure 2:
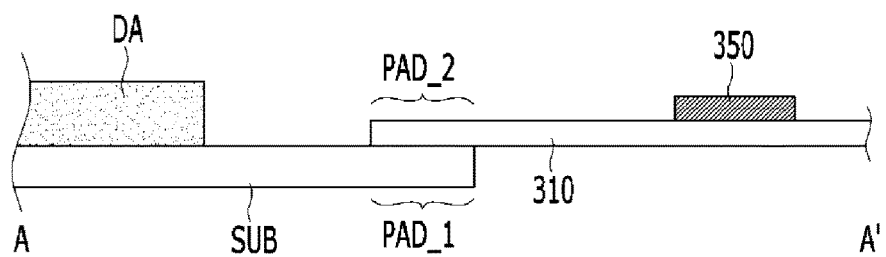
FIG. 2 is a cross-sectional view taken along line A-A' of FIG. 1.

FIG. 1 is a schematic plan view of a display device according to an exemplary embodiment and FIG. 2 is a cross-sectional view taken along line A-A' of FIG. 1.

Referring to FIGS. 1 and 2, the display device according to the exemplary embodiment may include a substrate SUB, a first pad part PAD_1, and a printed circuit board 300. The first pad part PAD_1 positioned on the substrate SUB is coupled with a second pad part PAD_2 of the printed circuit board 300 and the first pad part PAD_1 may include a first terminal area TL_1 in which a plurality of first pad terminals PAD_TL_A (see FIG. 5) is disposed and a second terminal area TL_2 in which a plurality of second pad terminals PAD_TL_B (see FIG. 9) is disposed. The second pad part PAD_2 may include a third terminal area TL_3 in which a plurality of first contact terminals PAD_TL_C (see FIG. 11) is disposed and a fourth terminal area TL_4 in which a plurality of second contact terminals (not illustrated) is disposed.

In the exemplary embodiment, the first contact terminal PAD_TL_C (see FIG. 11) of the printed circuit board 300 includes a plurality of first contact pad terminals ROW_PAD_E arranged along a first row R1 and a plurality of second contact pad terminals ROW_PAD_F arranged along a second row R2 and an area of the first contact pad terminal ROW_PAD_E may be disposed to be larger than an area of a second contact pad terminal ROW_PAD_F.

Further, the first pad terminal PAD_TL_A (see FIG. 5) coupled with the first contact terminal PAD_TL_C (see FIG. 11) may include a plurality of first connection pad terminals ROW_PAD_A and a plurality of second connection pad terminals ROW_PAD_B corresponding to the plurality of first contact pad terminals ROW_PAD_E and the plurality of second contact pad terminals ROW_PAD_F, respectively. In this case, similarly to the plurality of first contact pad terminals ROW_PAD_E and the plurality of second contact pad terminals ROW_PAD_F, the areas of the plurality of first connection pad terminals ROW_PAD_A may be disposed to be larger than the areas of the plurality of second connection pad terminals ROW_PAD_B.

The display device according to the exemplary embodiment may include a display area DA and a pad area PNL_PAD. The display area DA and the pad area PNL_PAD represent areas positioned on the substrate SUB.

The display area DA is an area displaying an image and a display panel 100 (see FIG. 3) emitting light may be positioned in the display area DA. The display panel 100 disposed in the display area DA will be described below.

The pad area PNL_PAD is an area positioned on the periphery of the display area DA and the printed circuit board 300 transferring a signal from the outside may be coupled to the pad area PNL_PAD. A first pad part PAD_1 is disposed in the pad area PNL_PAD and a second pad part PAD_2 is disposed in the printed circuit board 300, and as a result, the first pad part PAD_1 and the second pad part PAD_2 may be electrically coupled with each other.

In this case, the first pad part PAD_1 may include the first terminal area TL_1 and the second terminal area TL_2. The first terminal area TL_1 and the second terminal area TL_2 represent the areas positioned on the substrate SUB.

As described above, the plurality of first pad terminals PAD_TL_A (see FIG. 5) may be disposed in the first terminal area TL_1 and the plurality of second pad terminals PAD_TL_B (see FIG. 9) may be disposed in the second terminal area TL_2. In the exemplary embodiment, the plurality of first pad terminals PAD_TL_A (see FIG. 5) and the plurality of second pad terminals PAD_TL_B (see FIG. 9) may have different shapes. Structures of the first terminal area TL_1 and the second terminal area TL_2 will be described below in detail.

The first terminal area TL_1 and the second terminal area TL_2 constituting the pad area PNL_PAD may be arranged in line in a first direction. In this case, the pad area PNL_PAD may be disposed to be spaced apart from the display area DA in a second direction. Hereinafter, an X axis representing a coordinate in the drawing represents the first direction and a Y axis represents the second direction.

In the exemplary embodiment, as illustrated in FIG. 1, the first terminal area TL_1 may be positioned at each of both sides of the second terminal area TL_2. However, an arrangement structure of the first terminal area TL_1 and the second terminal area TL_2 is not limited thereto and the first terminal area TL_1 may be positioned between a pair of second terminal areas TL_2.

Meanwhile, a connection line CL may be positioned between the display area DA and the pad area PNL_PAD and the display area DA and the pad area PNL_PAD may be connected by the connection line CL. The connection line CL may be connected with a plurality of signal lines disposed in the display area DA. Further, the connection line CL may be connected with the first pad terminal PAD_TL_A (see FIG. 5) and the plurality of second pad terminals PAD_TL_B (see FIG. 9) of the pad area PNL_PAD.

In this case, the connection line CL may include a first connection line CL_A and a second connection line CL_B. The first connection line CL_A may connect the display area DA and the first terminal area TL_1 to each other and the second connection line CL_B may connect the display area DA and the second terminal area TL_2 to each other.

The printed circuit board 300 is coupled to the first pad part PAD_1 of the pad area PNL_PAD of the substrate SUB to transfer a signal required for driving the display panel 100 to the display panel 100. In this case, a driving chip 350 may be mounted on a base film 310 of the printed circuit board 300 and the driving chip 350 may be used for driving the display panel 100.

In this case, in the printed circuit board 300, the second pad part PAD_2 may be disposed at one end of the base film 310 and the second pad part PAD_2 may be coupled with the first pad part PAD_1 of the substrate SUB. The second pad part PAD_2 may be disposed to face the first pad part PAD_1.

The second pad part PAD_2 may include the third terminal area TL_3 and the fourth terminal area TL_4. The third terminal area TL_3 and the fourth terminal area TL_4 represent the areas positioned on the base film 310.

The plurality of first contact terminals PAD_TL_C (see FIG. 11) may be disposed in the third terminal area TL_3 and the plurality of second contact terminals (not illustrated) may be disposed in the fourth terminal area TL_4.

Figure 5:
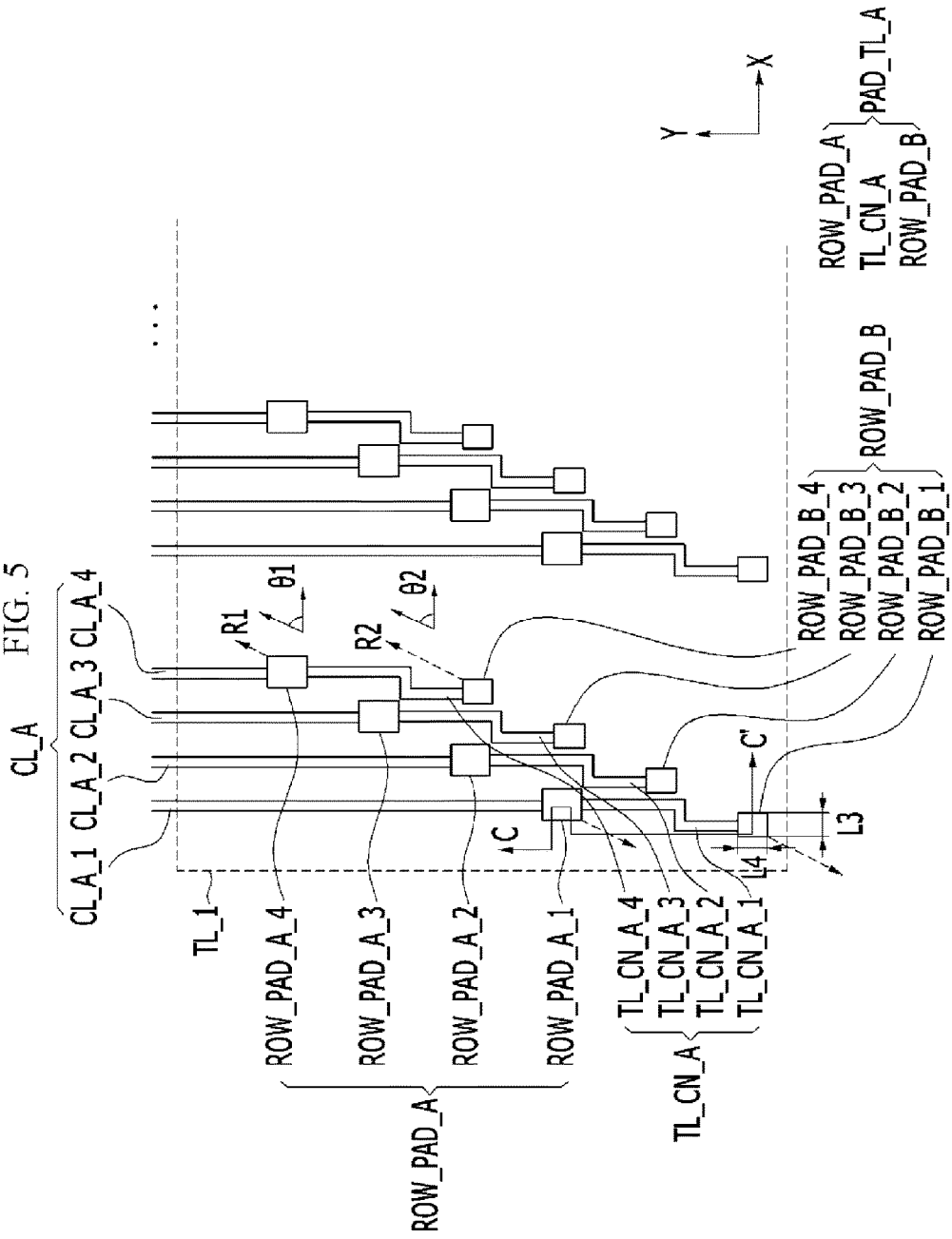
FIG. 5 is an enlarged diagram of a first terminal area of FIG. 1.

The plurality of first contact terminals PAD_TL_C (see FIG. 11) may have shapes corresponding to the plurality of first pad terminals PAD_TL_A (see FIG. 5). In addition, the plurality of second contact terminals (not illustrated) may have shapes corresponding to the plurality of second pad terminals PAD_TL_B (see FIG. 9).

That is, according to the exemplary embodiment, the second pad part PAD_2 of the printed circuit board 300 may have a shape corresponding to the first pad part PAD_1 of the substrate SUB. The plurality of contact terminals disposed in the second pad part PAD_2 may be disposed in the same or similar pattern as the plurality of pad terminals of the first pad part PAD_1. Structures of the third terminal area TL_3 and the fourth terminal area TL_4 will be described below in detail.

Hereinafter, the display panel 100 formed in the display area DA will be described in detail with reference to FIGS. 3 and 4.

Figure 3:
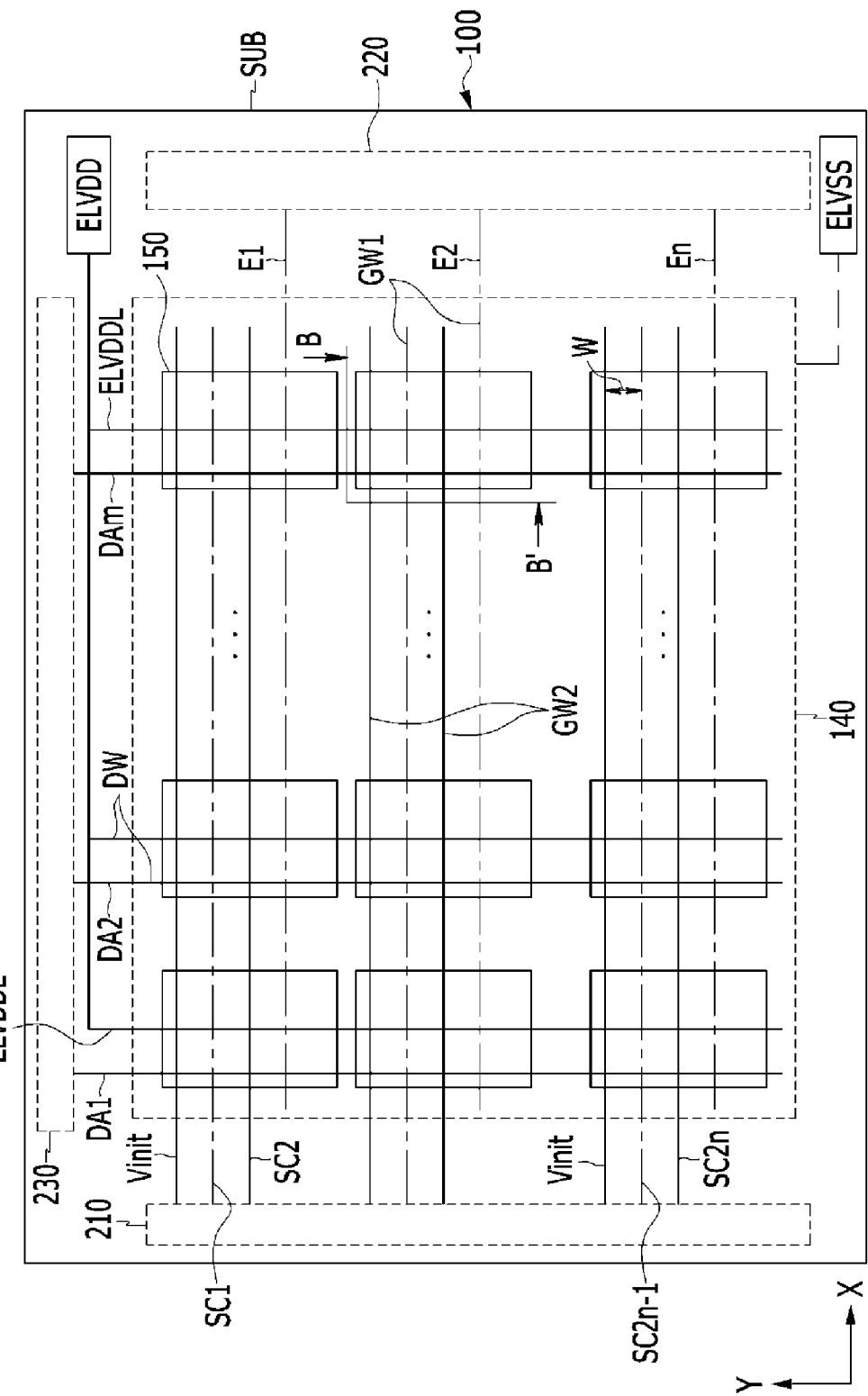
FIG. 3 is a diagram schematically illustrating a display area of FIG. 1.
Figure 4:
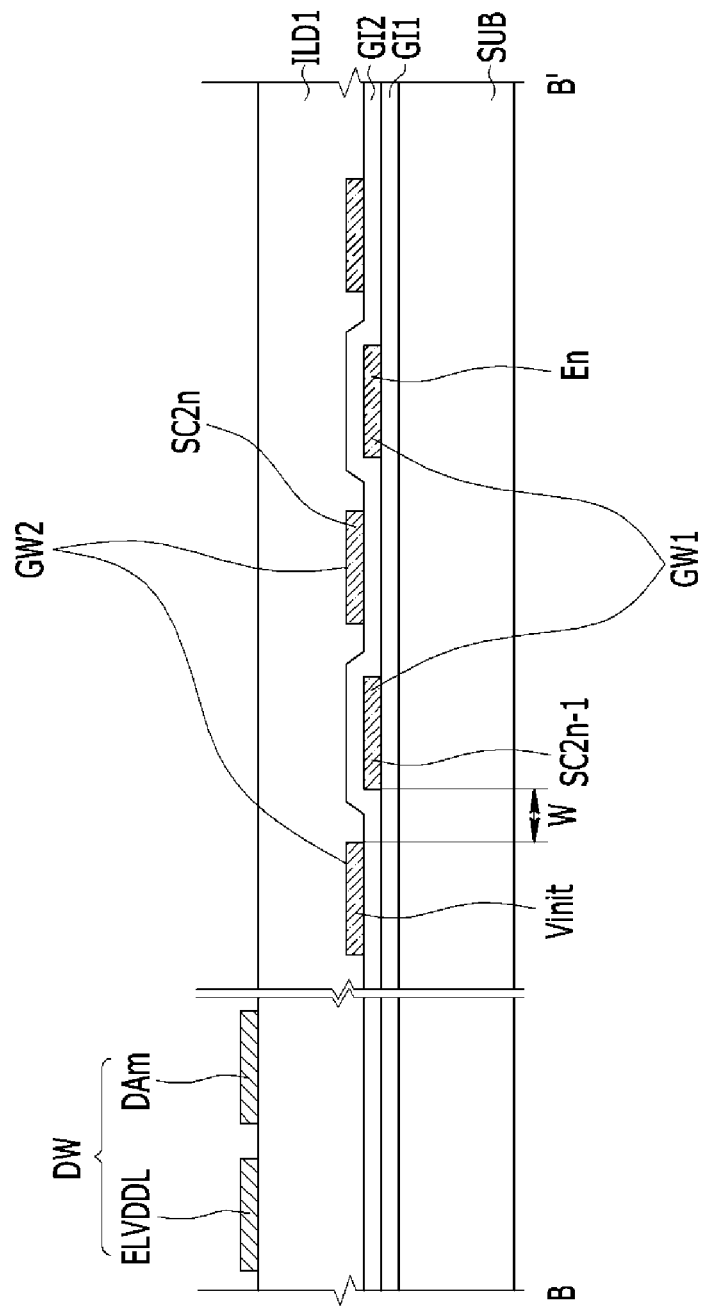
FIG. 4 is a cross-sectional view taken along line B-B' of FIG. 3.

FIG. 3 is a diagram schematically illustrating a display area of FIG. 1 and FIG. 4 is a cross-sectional view taken along line B-B' of FIG. 3.

According to the exemplary embodiment, the display panel 100 includes first gate wires GW1, second gate wires GW2, data wires DW, a display unit 140, and a pixel 150. In FIGS. 3 and 4, it is described that the gate wires includes the first gate wires GW1 and the second gate wires GW2 positioned on different layers, but the present invention is not limited thereto and the gate wires may be disposed on one layer.

The gate driving unit 210 sequentially supplies scan signals to first scan lines SC2 to SC2n or second scan lines SC1 to SC2n-1 included in the first gate wires GW1 or the second gate wires GW2 in response to control signals supplied from an external control circuit (not illustrated), for example, a timing control unit, and the like. Herein, n is an integer of 1 or more and hereinafter, it is the same.

Then, the pixel 150 is selected by the scan signals to sequentially receive data signals. Herein, the gate driving unit 210 illustrated in FIG. 3 may be disposed in the driving chip 350 (see FIG. 1) on the printed circuit board 300 (see FIG. 1) and is illustrated in FIG. 3 for easy description.

The first gate wires GW1 are positioned on the substrate SUB with a first insulating layer GI1 interposed therebetween and extend in the first direction. The first gate wires GW1 include the second scan line SC2n-1 and light emitting control lines E1 to En.

The second scan line SC2n-1 is connected with the gate driving unit 210 and receives the scan signal from the gate driving unit 210. The light emitting control line En is connected with a light emitting control driving unit 220 and receives a light emitting control signal from the light emitting control driving unit 220. Herein, the light emitting control driving unit 220 illustrated in FIG. 3 may be formed in the driving chip 350 (see FIG. 1) on the printed circuit board 300 (see FIG. 1) similarly to the gate driving unit 210 and is illustrated in FIG. 3 for easy description.

The second gate wires GW2 are positioned on the first gate wires GW1 with a second insulating layer GI2 interposed therebetween and extend in the first direction. The second gate wires GW2 include the first scan line SC2n and an initialization power line Vinit.

The first gate wires GW1 and the second gate wires GW2 do not overlap with each other.

The first scan line SC2n is connected with the gate driving unit 210 and receives the scan signal from the gate driving unit 210. The initialization power line Vinit is connected with the gate driving unit 210 and applied with initialization power from the gate driving unit 210.

In the exemplary embodiment of the present invention, the initialization power line Vinit is applied with the initialization power from the gate driving unit 210, but the initialization power line Vinit is connected with an additional other component to be applied with the initialization power from the additional other component.

The light emitting control driving unit 220 sequentially supplies the light emitting control signal to the light emitting control line En in response to the control signals supplied from the outside such as the timing control unit, and the like. Then, light emitting of the pixel 150 is controlled by the light emitting control signal.

That is, the light emitting control signal controls a light emitting time of the pixel 150. However, the light emitting control driving unit 220 may be omitted according to an internal structure of the pixel 150.

The data driving unit 230 supplies the data signal to a data line DAm among the data wires DW in response to the control signals supplied from the outside such as the timing control unit, and the like. The data signal supplied to the data line DAm is supplied to the pixel 150 selected by the scan signal whenever the scan signal is supplied to the first scan line SC2n or the second scan line SC2n−1. Then, the pixel 150 charges voltage corresponding to the data signal and emits light with luminance corresponding thereto. Herein, the data driving unit 230 illustrated in FIG. 3 may be formed in the driving chip 350 (see FIG. 1) on the printed circuit board 300 (see FIG. 1) to be described below similarly to the gate driving unit 210 and is illustrated in FIG. 3 for easy description.

The data wires DW are positioned on the second gate wires GW2 with a third insulating layer ILD1 interposed therebetween and extend in the second direction crossing the first direction. The data wires DW includes data lines DA1 to DAm and a driving power line ELVDDL. The data line DAm is connected with the data driving unit 230 and receives the data signal from the data driving unit 230. The driving power line ELVDDL is connected with an external first power supply ELVDD to be described below and receives driving power from the first power supply ELVDD.

In this case, the driving power line ELVDDL and the data line DAm may be formed on the third insulating layer ILD1 as the same layer. However, the present invention is not limited thereto and the driving power line ELVDDL and the data line DAm may be formed on different layers.

For example, the driving power line ELVDDL may be formed as the same layer as the first gate wires GW1 and the data line DAm may be formed on the same layer as the second gate wires GW2. On the contrary, the driving power line ELVDDL may be formed as the same layer as the second gate wires GW2 and the data line DAm may be formed on the same layer as the first gate wires GW1.

The display unit 140 includes a plurality of pixels 150 positioned at cross areas of the first gate wires GW1, the second gate wires GW2, and the data wires DW. Herein, each pixel 150 includes an organic light emitting element emitting light with luminance corresponding to driving current corresponding to the data signal and a pixel circuit for controlling driving current that flows on the organic light emitting element.

The pixel circuit is connected with each of the first gate wires GW1, the second gate wires GW2, and the data wires DW and the organic light emitting device is connected to the pixel circuit. The pixel 150 is described as the organic light emitting element, but the pixel 150 applied to the display device of the exemplary embodiment is not limited thereto and may be a liquid crystal display device, an electrophoretic display device, and the like.

The organic light emitting device of the display unit 140 is connected with the external first power supply ELVDD with the pixel circuit interposed therebetween and connected even with a second power supply ELVSS. The first power supply ELVDD and the second power supply ELVSS supply driving power and common power to the pixel 150 of the display unit 140 and the pixel 150 emits light with the luminance corresponding to the driving current from the first power supply ELVDD through the organic light emitting device in response to the data signal according to the driving power and the common power supplied to the pixel 150.

As described above, in the display device according to the exemplary embodiment of the present invention, all of the first gate wires GW1 and the second gate wires GW2 which are the gate wires which do not overlap with each other while crossing the pixel 150 in the first direction are not positioned on the same layer, but the first gate wires GW1 and the second gate wires GW2 are positioned on different layers with the second insulating layer GI2 interposed therebetween and thus positioned on different layers and a distance W between neighboring gate wires may be formed to be small, and as a result, more pixels 150 may be formed in the same area. That is, a high-resolution display device may be formed.

Hereinafter, a structure of the first pad terminal PAD_TL_A disposed in the first terminal area TL_1 will be described in detail with reference to FIGS. 5 to 8.

Figure 6:
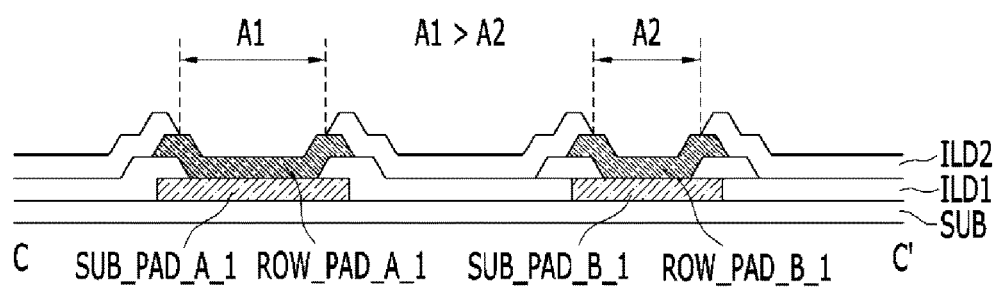
FIG. 6 is a cross-sectional view taken along line C-C' of FIG. 5.
Figure 7:
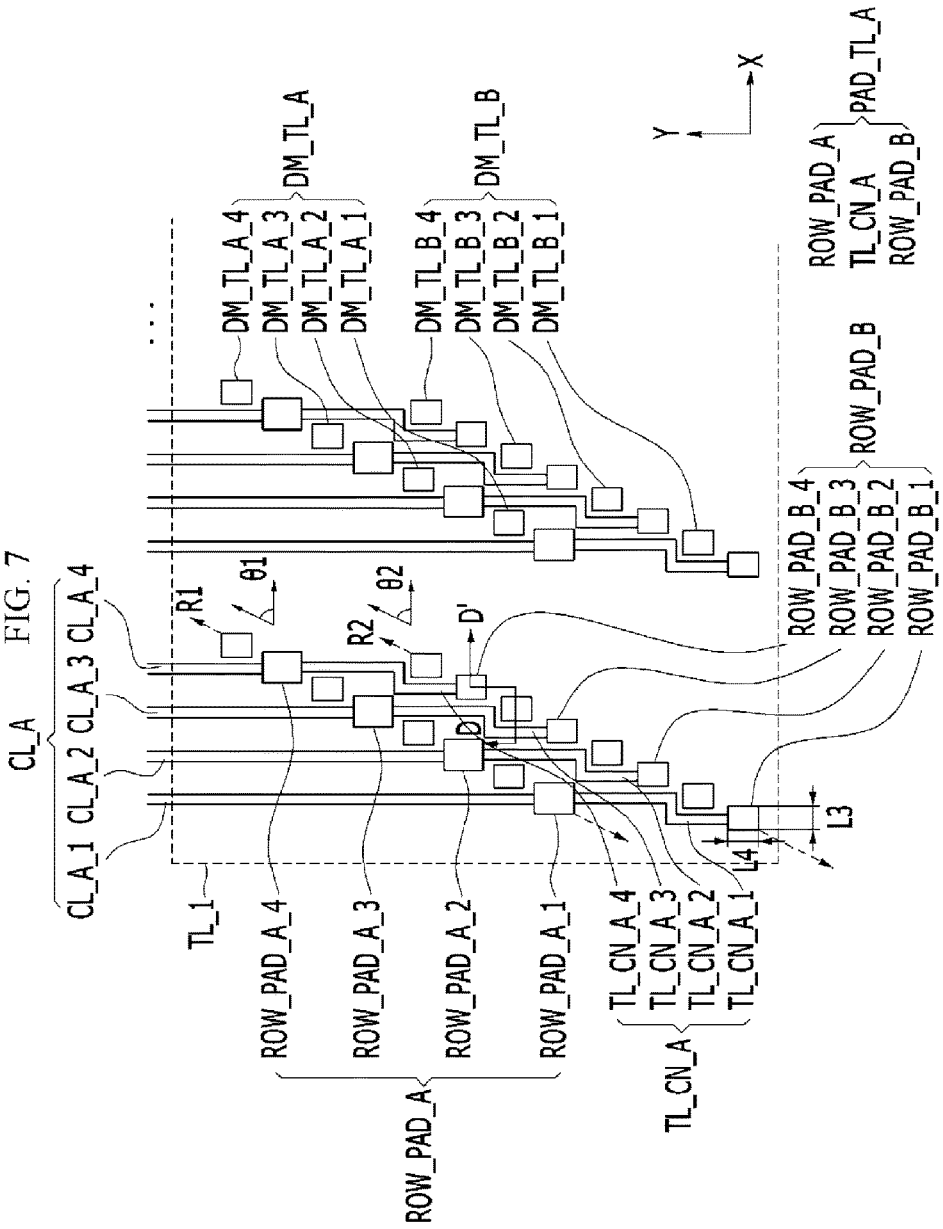
FIG. 7 is a diagram illustrating a modified example of the first terminal area of FIG. 5.
Figure 8:
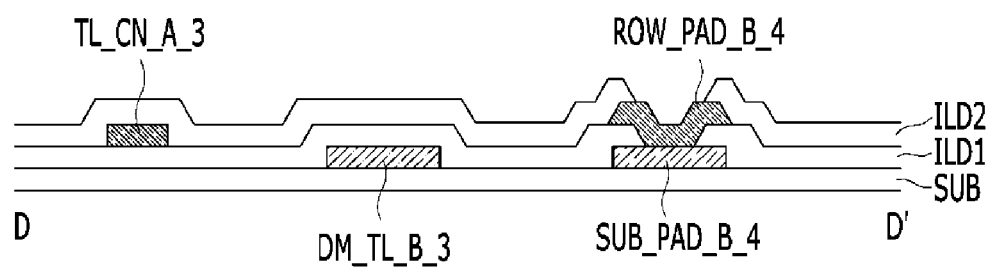
FIG. 8 is a cross-sectional view taken along line D-D' of FIG. 7.

FIG. 5 is an enlarged diagram of a first terminal area of FIG. 1 and FIG. 6 is a cross-sectional view taken along line C-C' of FIG. 5. FIG. 7 is a diagram illustrating a modified example of the first terminal area of FIG. 5 and FIG. 8 is a cross-sectional view taken along line D-D' of FIG. 5.

Referring to FIGS. 5 and 6, the plurality of first pad terminals PAD_TL_A may be disposed in the first terminal area TL_1. In this case, the plurality of first pad terminals PAD_TL_A may be connected with the power lines of the display area DA (see FIG. 1), for example, the driving power line ELVDDL, the common power line, the initialization power line, the scan line, and the like through the first connection line CL_A. The plurality of respective first pad terminals PAD_TL_A may be disposed to be spaced at a predetermined interval in the first direction within the first terminal area TL_1.

In the present exemplary embodiment, each of the plurality of first pad terminals PAD_TL_A may include the plurality of first connection pad terminals ROW_PAD_A, the plurality of second connection pad terminals ROW_PAD_B, and a first terminal connection line TL_CN_A.

The plurality of first connection pad terminals ROW_PAD_A may be disposed to be spaced apart from each other in one direction. In this case, the plurality of first connection pad terminals ROW_PAD_A may be arranged along a first row R1 having a first inclination angle θ1 with the first direction. The first inclination angle θ1 may be 0° to 90° (however, 0° and 90° are excluded).

All of the plurality of first connection pad terminals ROW_PAD_A disposed in the first terminal area TL_1 may be disposed to be inclined in the same direction. That is, the first connection pad terminals ROW_PAD_A may be arranged to be inclined at the same angle based on the first direction in the first terminal area TL_1. For example, as illustrated in FIG. 5, the first connection pad terminal ROW_PAD_A may be arranged to be inclined approximately in a 1 o'clock direction based on the second direction.

In the exemplary embodiment, the plurality of first connection pad terminals ROW_PAD_A may be arranged on the substrate SUB along the first row R1 and the first contact pad terminals ROW_PAD_E (see FIG. 11) of the printed circuit board 300 may be disposed on the plurality of first connection pad terminals ROW_PAD_A to overlap with each other. In this case, first contact holes CT_1 (see FIGS. 11 and 12) may be disposed on the first contact pad terminal ROW_PAD_E (see FIGS. 11 and 12) of the printed circuit board 300 to overlap with each other. Accordingly, when viewed on a plane, the first contact pad terminal ROW_PAD_E (see FIG. 12) and the first contact hole CT_1 (see FIG. 12) may be sequentially disposed on the first connection pad terminal ROW_PAD_A arranged along the first row R1 to overlap with each other.

In the exemplary embodiment, the first terminal area TL_1 may be disposed at each of the left and right sides of the second terminal area TL_2 and all of the plurality of first connection pad terminals ROW_PAD_A of the first terminal area TL_1, which are disposed at the left and right sides may be arranged to be inclined at the same angle.

Meanwhile, intervals of the adjacent first connection pad terminals ROW_PAD_A may be the same as each other. For example, the interval between the first connection pad terminal ROW_PAD_A_1 and the first connection pad terminal ROW_PAD_A_2, the interval between the first connection pad terminal ROW_PAD_A_2 and the first connection pad terminal ROW_PAD_A_3, and the interval between the first connection pad terminal ROW_PAD_A_3 and the first connection pad terminal ROW_PAD_A_4 may be the same as each other. Herein, the interval between the first connection pad terminals ROW_PAD_A represents a distance at which the first connection pad terminals ROW_PAD_A are spaced apart from each other along the first row R1.

The first connection pad terminal ROW_PAD_A as an area electrically contacting the first contact pad terminal ROW_PAD_E of the printed circuit board 300 may have a substantially quadrangular shape.

The plurality of second connection pad terminals ROW_PAD_B may be disposed to be spaced apart from the plurality of first connection pad terminals ROW_PAD_A in the second direction. Similarly to the plurality of first connection pad terminals ROW_PAD_A, the plurality of second connection pad terminals ROW_PAD_B may be disposed to be spaced apart from each other in one direction.

In this case, the plurality of second connection pad terminals ROW_PAD_B may be arranged along a second row R2 having a second inclination angle θ2 with the first direction. The second inclination angle θ2 may be 0° to 90° (however, 0° and 90° are excluded).

All of the plurality of second connection pad terminals ROW_PAD_B arranged in the first terminal area TL_1 may be disposed to be inclined in the same direction similarly to the first connection pad terminal ROW_PAD_A. That is, the second connection pad terminals ROW_PAD_B may be arranged to be inclined at the same angle based on the first direction in the first terminal area TL_1. For example, as illustrated in FIG. 5, the second connection pad terminal ROW_PAD_B may be arranged to be inclined approximately in a 1 o'clock direction based on the second direction.

Similarly to the first connection pad terminal ROW_PAD_A, all of the second connection pad terminals ROW_PAD_B of the first terminal area TL_1 disposed at the left and right sides of the second terminal area TL_2 may be disposed to be inclined at the same angle.

In the exemplary embodiment, the first inclination angle θ1 and the second inclination angle θ2 may be the same as each other. Accordingly, the first connection pad terminal ROW_PAD_A and the second connection pad terminal ROW_PAD_B may be arranged to be inclined at the same angle in the first direction. However, the present invention is not limited thereto and the first inclination angle θ1 and the second inclination angle θ2 may be different from each other. That is, the first connection pad terminal ROW_PAD_A and the second connection pad terminal ROW_PAD_B may be arranged to be inclined at different angles in the first direction.

However, the present invention is not limited thereto and the plurality of first pad terminals PAD_TL_A disposed in the first terminal area TL_1 at both sides may be disposed to be symmetric to each other based on the second terminal area TL_2. For example, the plurality of first pad terminals PAD_TL_A disposed in the first terminal area TL_1 at the left side based on the second terminal area TL_2 may be disposed to be inclined approximately in the 1 o'clock direction and the plurality of first pad terminal PAD_TL_A at the right side based on the second terminal area TL_2 may be disposed to be inclined approximately in an 11 o'clock direction.

Meanwhile, the intervals of the adjacent second connection pad terminals ROW_PAD_B may be the same as each other. For example, the interval between the second connection pad terminal ROW_PAD_B_1 and the second connection pad terminal ROW_PAD_B_2, the interval between the second connection pad terminal ROW_PAD_B_2 and the second connection pad terminal ROW_PAD_B_3, and the interval between the second connection pad terminal ROW_PAD_B_3 and the second connection pad terminal ROW_PAD_B_4 may be the same as each other. Herein, the interval between the second connection pad terminals ROW_PAD_B represents a distance at which the second connection pad terminals ROW_PAD_B are spaced apart from each other along the second row R2.

The second connection pad terminal ROW_PAD_B as an area electrically contacting the second contact pad terminal ROW_PAD_F of the printed circuit board 300 may have the substantially quadrangular shape.

A quadrangle forming a shape of each of the first connection pad terminal ROW_PAD_A and the second connection pad terminal ROW_PAD_B may include a third side L3 parallel to the first direction (X axis) and a fourth side L4 parallel to the second direction (Y axis). Herein, the third side L3 and the fourth side L4 may be neighboring to each other.

In this case, in the quadrangle, the fourth side L4 may be formed to be longer than the third side L3 (L3<L4). That is, the quadrangle may be a rectangular shape which elongates in the second direction (Y axis). However, the present invention is not limited thereto and the third side L3 and the fourth side L4 may be the same as each other. That is, the quadrangle may include a square.

According to the exemplary embodiment, when each of the first connection pad terminal ROW_PAD_A and the second connection pad terminal ROW_PAD_B forms the rectangular shape which elongates in the second direction, the interval between the first connection pad terminals ROW_PAD_A or the second connection pad terminals ROW_PAD_B in the first direction (X axis) may be reduced.

Accordingly, the number of first connection pad terminals ROW_PAD_A and second connection pad terminals ROW_PAD_B disposed in the first terminal area TL_1 may be increased.

Meanwhile, in the exemplary embodiment, an area A1 of the first connection pad terminal ROW_PAD_A may be larger than an area A2 of the second connection pad terminal ROW_PAD_B (A1>A2). An area A1 of the first connection pad terminal ROW_PAD_A arranged on the first row R1 may be larger than an area A2 of the second connection pad terminal ROW_PAD_B arranged on the second row R2. That is, the area A1 of the first connection pad terminal ROW_PAD_A positioned to be closer to the display area DA than the second connection pad terminal ROW_PAD_B may be larger than the area A2 of the second connection pad terminal ROW_PAD_B. Herein, the areas A1 and A2 of the first connection pad terminal ROW_PAD_A and the second connection pad terminal ROW_PAD_B represent the areas of the first connection pad terminal ROW_PAD_A and the second connection pad terminal ROW_PAD_B exposed by a fourth insulating layer ILD2. For easy description, in FIG. 6, width direction A1 of the first connection pad terminal ROW_PAD_A_1 and width direction A2 of the second connection pad terminal ROW_PAD_B_1 are written as the areas.

An area relationship of the first connection pad terminal ROW_PAD_A and the second connection pad terminal ROW_PAD_B may correspond to the area relationship of the first contact pad terminal ROW_PAD_E and the second contact pad terminal ROW_PAD_F of the printed circuit board 300 coupled to the first connection pad terminal ROW_PAD_A and the second connection pad terminal ROW_PAD_B, respectively. The area relationship of the first contact pad terminal ROW_PAD_E and the second contact pad terminal ROW_PAD_F will be described below in detail.

Meanwhile, the plurality of first connection pad terminals ROW_PAD_A and the plurality of second connection pad terminal ROW_PAD_B may be connected by a plurality of first terminal connection lines TL_CN_A. In more detail, the plurality of first terminal connection lines TL_CN_A may connect one of the plurality of first connection pad terminals ROW_PAD_A and one of the plurality of first connection pad terminal ROW_PAD_B with each other.

For example, the first connection pad terminal ROW_PAD_A_1 and the second connection pad terminal ROW_PAD_B_1 may be connected to each other by the first terminal connection line TL_CN_A_1, and the first connection pad terminal ROW_PAD_A_2 and the second connection pad terminal ROW_PAD_B_2 may be connected to each other by the first terminal connection line TL_CN_A_2. In addition, the first connection pad terminal ROW_PAD_A_3 and the second connection pad terminal ROW_PAD_B_3 may be connected to each other by the first terminal connection line TL_CN_A_3, and the first connection pad terminal ROW_PAD_A_4 and the second connection pad terminal ROW_PAD_B_4 may be connected to each other by the first terminal connection line TL_CN_A_4.

According to the exemplary embodiment, each of the plurality of first terminal connection lines TL_CN_A may have a shape in which each first terminal connection line is bent once or more. For example, as illustrated in FIG. 5, the first terminal connection line TL_CN_A_1 extends from the second connection pad terminal ROW_PAD_B_1 to the first connection pad terminal ROW_PAD_A_1 in the second direction. In this case, the first terminal connection line TL_CN_A_1 may be disposed to be bent in the first direction and thereafter, bent in the second direction again. That is, the first terminal connection line TL_CN_A_1 may be disposed in a shape in which the first terminal connection line is bent twice.

Meanwhile, the plurality of first connection pad terminals ROW_PAD_A may be connected with the first connection line CL_A. For example, the first connection pad terminal ROW_PAD_A_1 may be connected with the first connection line CL_A_1 and the first connection pad terminal ROW_PAD_A_2 may be connected with the first connection line CL_A_2. The first connection pad terminal ROW_PAD_A_3 may be connected with the first connection line CL_A_3 and the first connection pad terminal ROW_PAD_A_4 may be connected with the first connection line CL_A_4.

Referring to FIG. 5, the plurality of first connection pad terminals ROW_PAD_A is arranged along the first row R1 and the plurality of second connection pad terminals ROW_PAD_B is arranged along the second row R2. However, the present invention is not limited thereto and as illustrated in FIG. 7, at least one first dummy pad terminal DM_TL_A may be disposed among the plurality of first connection pad terminals ROW_PAD_A and at least one second dummy pad terminal DM_TL_B may be disposed among the plurality of second connection pad terminals ROW_PAD_B.

Referring to FIG. 7, at least one first dummy pad terminal DM_TL_A may be disposed between one pair of adjacent first connection pad terminals ROW_PAD_A among the plurality of first connection pad terminals ROW_PAD_A.

For example, one first dummy pad terminal DM_TL_A_1 may be disposed between the first connection pad terminal ROW_PAD_A_1 and the first connection pad terminal ROW_PAD_A_2, and one first dummy pad terminal DM_TL_A_2 may be disposed between the first connection pad terminal ROW_PAD_A_2 and the first connection pad terminal ROW_PAD_A_3. One first dummy pad terminal DM_TL_A_3 may be disposed between the first connection pad terminal ROW_PAD_A_3 and the first connection pad terminal ROW_PAD_A_4, and one first dummy pad terminal DM_TL_A_4 may be disposed adjacent to the first connection pad terminal ROW_PAD_A_4.

In FIG. 7, it is illustrated that one first dummy pad terminal DM_TL_A is disposed between one pair of adjacent first connection pad terminals ROW_PAD_A. However, the present invention is not limited thereto and two or more first dummy pad terminals DM_TL_A may be disposed.

In this case, the plurality of first connection pad terminals ROW_PAD_A and the first dummy pad terminal DM_TL_A may be arranged in parallel with each other. That is, the first connection pad terminal ROW_PAD_A and the first dummy pad terminal DM_TL_A may be arranged in line along the first row R1 and may be disposed to be inclined at the first inclination angle θ1 in the first direction.

At least one first dummy pad terminal DM_TL_A is disposed between one pair of adjacent first connection pad terminals ROW_PAD_A and the interval between the adjacent first connection pad terminals ROW_PAD_A is thus increased to prevent capacitive coupling, that is, coupling which occurs between the first connection pad terminals ROW_PAD_A.

Further, at least one second dummy pad terminal DM_TL_B may be disposed between one pair of adjacent second connection pad terminals ROW_PAD_B among the plurality of second connection pad terminals ROW_PAD_B.

For example, one second dummy pad terminal DM_TL_B_1 may be disposed between the second connection pad terminal ROW_PAD_B_1 and the second connection pad terminal ROW_PAD_B_2, and one second dummy pad terminal DM_TL_B_2 may be disposed between the second connection pad terminal ROW_PAD_B_2 and the second connection pad terminal ROW_PAD_B_3. One second dummy pad terminal DM_TL_B_3 may be disposed between the second connection pad terminal ROW_PAD_B_3 and the second connection pad terminal ROW_

PAD_B_4, and one second dummy pad terminal DM_TL_B_4 may be disposed adjacent to the second connection pad terminal ROW_PAD_B_4.

In FIG. 7, it is illustrated that one second dummy pad terminal DM_TL_B is disposed between one pair of adjacent second connection pad terminals ROW_PAD_B. However, the present invention is not limited thereto and two or more second dummy pad terminals DM_TL_B may be disposed.

The second connection pad terminal ROW_PAD_B and the second dummy pad terminal DM_TL_B may be arranged in parallel with each other. That is, the second connection pad terminal ROW_PAD_B and the second dummy pad terminal DM_TL_B may be arranged in series along the second row R2 and may be disposed to be inclined at the second inclination angle θ2 in the first direction.

In the exemplary embodiment, the first connection pad terminal ROW_PAD_A and the second connection pad terminal ROW_PAD_B are disposed to be inclined at a predetermined angle in the first direction, and as a result, a lot of pad terminals may be disposed in a predetermined area.

Meanwhile, referring to FIGS. 7 and 8, the plurality of first connection pad terminals ROW_PAD_A and the first dummy pad terminal DM_TL_A may be disposed on different layers. In addition, the plurality of second connection pad terminals ROW_PAD_B and the second dummy pad terminal DM_TL_B may also be disposed on different layers.

In detail, as illustrated in FIG. 8, the second connection pad terminal ROW_PAD_B_4 and the second dummy pad terminal DM_TL_B_3 may be disposed on different layers on the substrate SUB. The third insulating layer ILD1 may be disposed between the second connection pad terminal ROW_PAD_B_4 and the second dummy pad terminal DM_TL_B_3. The second dummy pad terminal DM_TL_B_3 may be disposed below the third insulating layer ILD1 and the second connection pad terminal ROW_PAD_B_4 may be disposed above the third insulating layer ILD1, based on the third insulating layer ILD1.

Further, the second connection pad terminal ROW_PAD_B_4 and the first terminal connection line TN_CN_A_3 may be disposed above the third insulating layer ILD1. That is, the second connection pad terminal ROW_PAD_B_4 and the first terminal connection line TN_CN_A_3 may be positioned on the same layer. However, the present invention is not limited thereto and the first terminal connection line TN_CN_A_3 may be disposed on the same layer as the second dummy pad terminal DM_TL_B_3.

A through-hole through which a part of a lower pad line SUB_PAD_B_4 positioned below the third insulating layer ILD1 is exposed may be formed on the third insulating layer ILD1. The second connection pad terminal ROW_PAD_B_4 may contact the lower pad line SUB_PAD_B_4 through the through-hole.

A fourth insulating layer ILD2 covering the second connection pad terminal ROW_PAD_B_4 and the first terminal connection line TN_CN_A_3 may be positioned above the third insulating layer ILD1. The through-hole that exposes a part of the second connection pad terminal ROW_PAD_B_4 may be formed in the fourth insulating layer ILD2. In this case, the exposed second connection pad terminal ROW_PAD_B_4 may be electrically connected with a fourth contact pad terminal ROW_PAD_F (see FIG. 15) of the printed circuit board 300 through a conductive ball CNB (see FIG. 15).

Hereinafter, a structure of the second pad terminal PAD_TL_B disposed in the second terminal area TL_2 will be described in detail with reference to FIG. 9.

Figure 9:
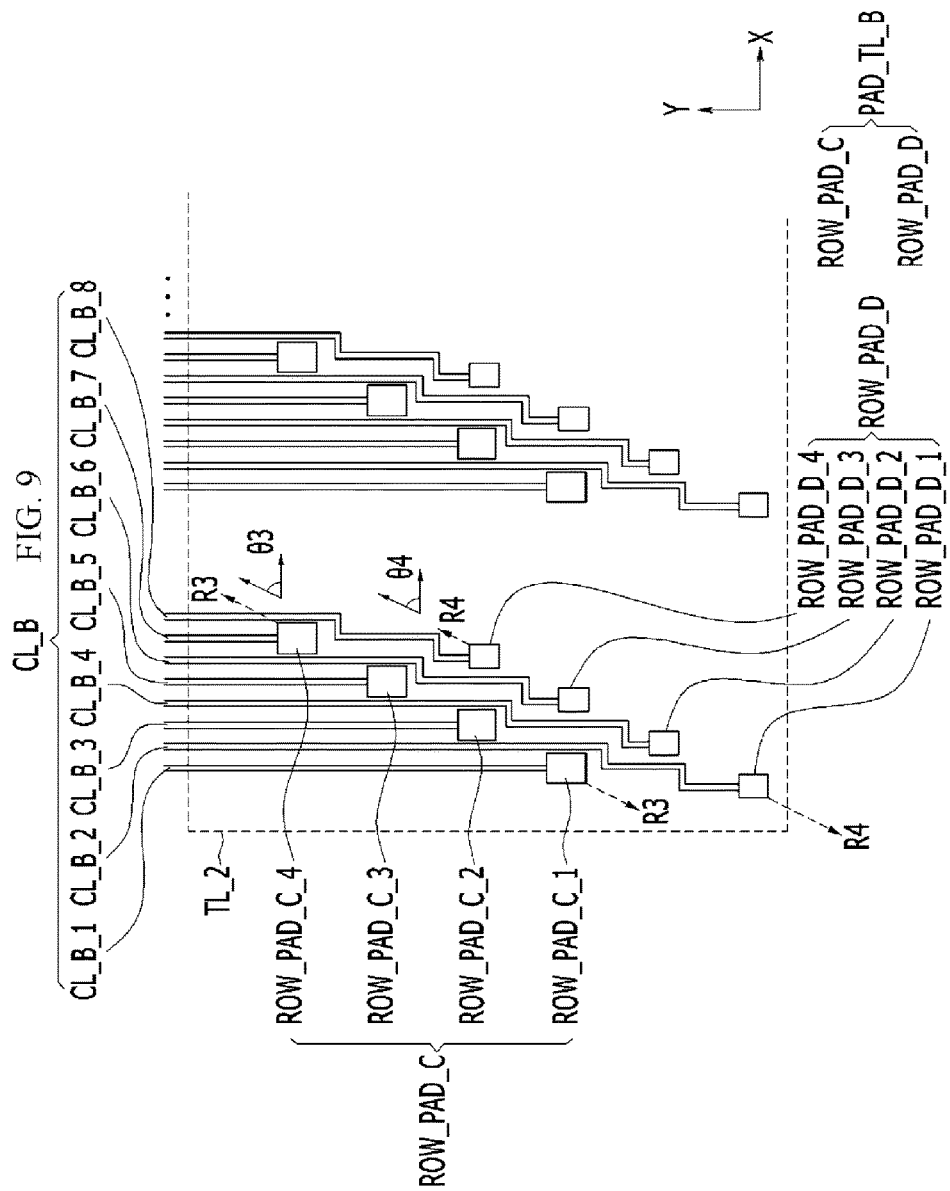
FIG. 9 is an enlarged diagram of a second terminal area of FIG. 1.

FIG. 9 is an enlarged diagram of a second terminal area of FIG. 1.

Referring to FIG. 9, the plurality of second pad terminals PAD_TL_B may be disposed in the second terminal area TL_2. In this case, the second terminal area TL_2 may be connected with the data wires DW (see FIG. 3) disposed in the display area DA through the second connection line CL_B. The plurality of respective second pad terminals PAD_TL_B may be disposed to be spaced at a predetermined interval in the first direction within the second terminal area TL_2.

Each of the plurality of second pad terminals PAD_TL_B may include a plurality of third connection pad terminals ROW_PAD_C and a plurality of fourth connection pad terminals ROW_PAD_D.

The third connection pad terminals ROW_PAD_C may be disposed to be spaced apart from each other in one direction. In this case, the third connection pad terminals ROW_PAD_C may be arranged along a third row R3 having a third inclination angle θ3 with the first direction. The third inclination angle θ3 may be 0° to 90° (however, 0° and 90° are excluded).

All of the third connection pad terminals ROW_PAD_C disposed in the second terminal area TL_2 may be disposed to be inclined in the same direction. That is, the third connection pad terminals ROW_PAD_C may be disposed to be inclined at the same angle based on the X axis within the second terminal area TL_2. For example, as illustrated in FIG. 1, the third connection pad terminal ROW_PAD_C may be disposed to be inclined approximately in the 1 o'clock direction.

However, the present invention is not limited thereto and the plurality of third connection pad terminals ROW_PAD_C disposed in the second terminal area TL_2 may be disposed to be symmetric to each other based on the center of the second terminal area TL_2. For example, the plurality of third connection pad terminals ROW_PAD_C at the left side based on the center of the second terminal area TL_2 may be disposed to be inclined approximately in the 1 o'clock direction and the plurality of third connection pad terminals ROW_PAD_C at the right side based on the center of the second terminal area TL_2 may be disposed to be inclined approximately in the 11 o'clock direction.

Meanwhile, intervals of the adjacent third connection pad terminals ROW_PAD_C may be the same as each other. For example, the interval between the third connection pad terminal ROW_PAD_C_1 and the third connection pad terminal ROW_PAD_C_2, the interval between the third connection pad terminal ROW_PAD_C_2 and the third connection pad terminal ROW_PAD_C_3, and the interval between the third connection pad terminal ROW_PAD_C_3 and the third connection pad terminal ROW_PAD_C_4 may be the same as each other. Herein, the interval between the third connection pad terminals ROW_PAD_C represents a distance at which the third connection pad terminals ROW_PAD_C are spaced apart from each other along the third row R3.

The fourth connection pad terminal ROW_PAD_D may be disposed to be spaced apart from the third connection pad terminal ROW_PAD_C in the second direction. Similarly to the third connection pad terminals ROW_PAD_C, the fourth connection pad terminals ROW_PAD_D may be disposed to be spaced apart from each other in one direction.

In this case, the fourth connection pad terminals ROW_PAD_D may be arranged along a fourth row R4 having a fourth inclination angle θ4 with the first direction. The fourth inclination angle θ4 may be 0° to 90° (however, 0° and 90° are excluded).

All of the fourth connection pad terminals ROW_PAD_D disposed in the second terminal area TL_2 may be disposed to be inclined in the same direction similarly to the third connection pad terminals ROW_PAD_C. That is, the fourth connection pad terminals ROW_PAD_D may be disposed to be inclined at the same angle based on the X axis within the second terminal area TL_2. For example, as illustrated in FIG. 1, the fourth connection pad terminal ROW_PAD_D may be disposed to be inclined approximately in the 1 o'clock direction.

Meanwhile, all of the fourth connection pad terminals ROW_PAD_D disposed in the second terminal area TL_2 may be disposed to be inclined in the same direction. That is, the fourth connection pad terminals ROW_PAD_D may be disposed to be inclined at the same angle based on the X axis within the second terminal area TL_2. For example, as illustrated in FIG. 1, the fourth connection pad terminal ROW_PAD_D may be disposed to be inclined approximately in the 1 o'clock direction.

However, the present invention is not limited thereto and the plurality of fourth connection pad terminals ROW_PAD_D disposed in the second terminal area TL_2 may be disposed to be symmetric to each other based on the center of the second terminal area TL_2. For example, the plurality of fourth connection pad terminals ROW_PAD_D at the left side based on the center of the second terminal area TL_2 may be disposed to be inclined approximately in the 1 o'clock direction and the plurality of fourth connection pad terminals ROW_PAD_D at the right side based on the center of the second terminal area TL_2 may be disposed to be inclined approximately in the 11 o'clock direction.

In the exemplary embodiment, the third inclination angle θ3 and the fourth inclination angle θ4 may be the same as each other. Accordingly, both the third connection pad terminal ROW_PAD_C and the fourth connection pad terminal ROW_PAD_D may be arranged to be inclined at the same angle in the first direction. However, the present invention is not limited thereto and the third inclination angle θ3 and the fourth inclination angle θ4 may be different from each other. That is, the third connection pad terminal ROW_PAD_C and the fourth connection pad terminal ROW_PAD_D may be arranged to be inclined at different angles in the first direction.

Meanwhile, the intervals of the adjacent fourth connection pad terminals ROW_PAD_D may be the same as each other. For example, the interval between the fourth connection pad terminal ROW_PAD_D_1 and the fourth connection pad terminal ROW_PAD_D_2, the interval between the fourth connection pad terminal ROW_PAD_D_2 and the fourth connection pad terminal ROW_PAD_D_3, and the interval between the fourth connection pad terminal ROW_PAD_D_3 and the fourth connection pad terminal ROW_PAD_D_4 may be the same as each other. Herein, the interval between the fourth connection pad terminals ROW_PAD_D represents a distance at which the fourth connection pad terminals ROW_PAD_D are spaced apart from each other along the fourth row R4.

Meanwhile, in the exemplary embodiment, each of the third connection pad terminal ROW_PAD_C and the fourth connection pad terminal ROW_PAD_D of the second terminal area TL_2 may be connected to the second connection line CL_B. Unlike the second connection pad terminal ROW_PAD_B of FIG. 5, the fourth connection pad terminal ROW_PAD_D may be directly connected to the second connection line CL_B.

For example, the third connection pad terminal ROW_PAD_C_1 may be connected with the second connection line CL_B_1 and the fourth connection pad terminal ROW_PAD_D_1 may be connected with the second connection line CL_B_2. The third connection pad terminal ROW_PAD_C_2 may be connected with the second connection line CL_B_3, and the fourth connection pad terminal ROW_PAD_D_2 may be connected with the second connection line CL_B_4. The third connection pad terminal ROW_PAD_C_3 may be connected with the second connection line CL_B_5, and the fourth connection pad terminal ROW_PAD_D_3 may be connected with the second connection line CL_B_6. The third connection pad terminal ROW_PAD_C_4 may be connected with the second connection line CL_B_7, and the fourth connection pad terminal ROW_PAD_D_4 may be connected with the second connection line CL_B_8.

Similarly to the plurality of first connection pad terminals ROW_PAD_A and the plurality of second connection pad terminals ROW_PAD_B, the area of the third connection pad terminal ROW_PAD_C may be larger than the area of the fourth connection pad terminal ROW_PAD_D. The area of the third connection pad terminal ROW_PAD_C arranged on the third row R3 may be larger than the area of the fourth connection pad terminal ROW_PAD_D arranged on the fourth row R4. That is, the area of the third connection pad terminal ROW_PAD_C positioned to be closer to the display area DA than the fourth connection pad terminal ROW_PAD_D may be larger than the area of the fourth connection pad terminal ROW_PAD_D. Similarly to the first connection pad terminal ROW_PAD_A and the second connection pad terminal ROW_PAD_B, the areas of the third connection pad terminal ROW_PAD_C and the fourth connection pad terminal ROW_PAD_D represent the areas of the third connection pad terminal ROW_PAD_C and the fourth connection pad terminal ROW_PAD_D exposed by the insulating layer.

Hereinafter, the printed circuit board 300 coupled to the display device according to the exemplary embodiment will be described with reference to FIGS. 10 to 12.

Figure 10:
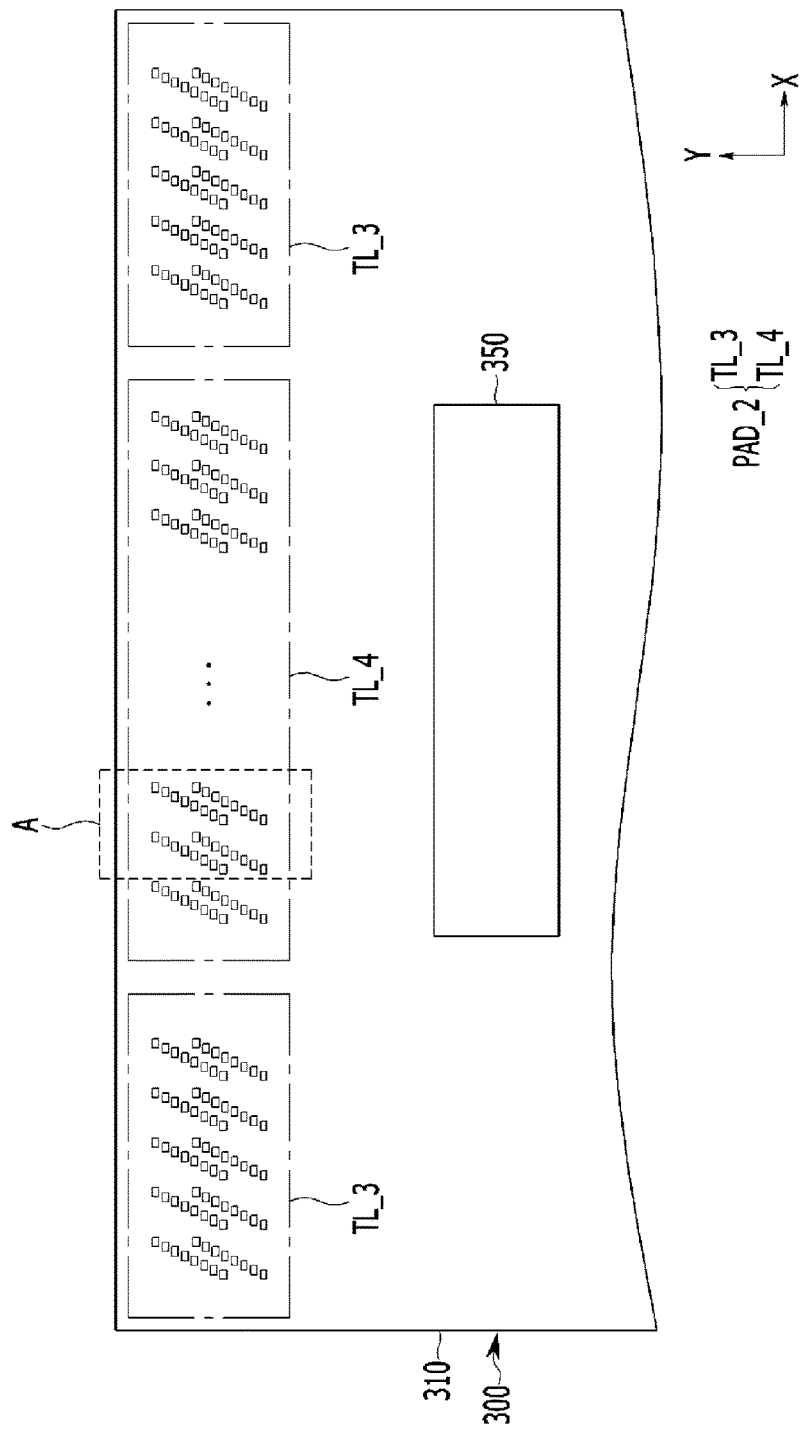
FIG. 10 is a schematic plan view of a printed circuit board coupled to the display device of FIG. 1.
Figure 11:
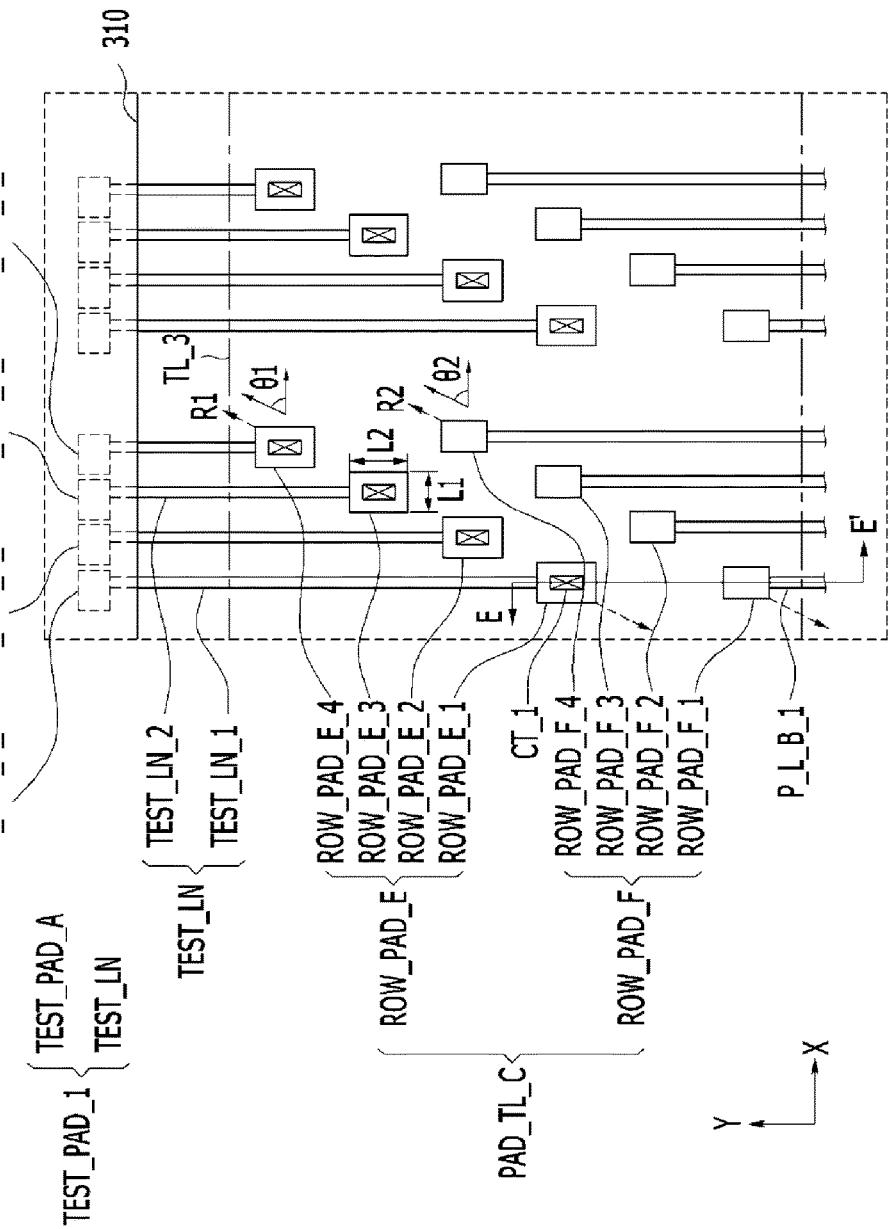
FIG. 11 is an enlarged diagram of area A of FIG. 10.
Figure 12:
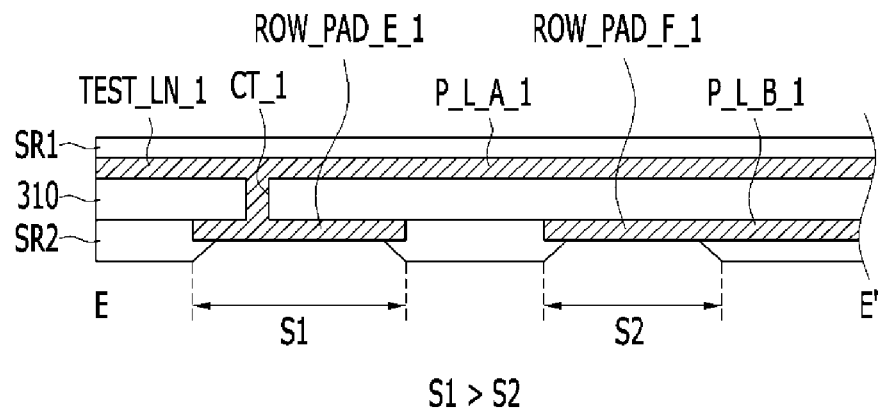
FIG. 12 is a cross-sectional view taken along line E-E' of FIG. 11.

FIG. 10 is a schematic plan view of the printed circuit board coupled to the display device of FIG. 1, FIG. 11 is an enlarged diagram of area A of FIG. 10, and FIG. 12 is a cross-sectional view taken along line E-E' of FIG. 11.

Referring to FIG. 10, the printed circuit board 300 may include the base film 310, the second pad part PAD_2, and the driving chip 350.

The second pad part PAD_2 may be disposed at one end of the base film 310 which is flexible. According to the exemplary embodiment, the second pad part PAD_2 may have a shape corresponding to the shape of the first pad part PAD_1 of the substrate SUB. The second pad part PAD_2 of the printed circuit board 300 and the first pad part PAD_1 of the substrate SUB have a shape corresponding to each other, and as a result, the first pad part PAD_1 and the second pad part PAD_2 may be easily coupled to each other.

The second pad part PAD_2 may include the third terminal area TL_3 and the fourth terminal area TL_4. The third terminal area TL_3 and the fourth terminal area TL_4 represent the areas positioned on the base film 310. The third terminal area TL_3 and the fourth terminal area TL_4 may be arranged in parallel to each other in the first direction (X axis) on the base film 310.

According to the exemplary embodiment, the third terminal area TL_3 may be disposed at each of both sides of the fourth terminal area TL_4. However, the present invention is not limited thereto and the third terminal area TL_3 may be disposed between one pair of fourth terminal areas TL_4.

However, the arrangements of the third terminal area TL_3 and the fourth terminal area TL_4 are determined according to the arrangements of the first terminal area TL_1 and the second terminal area TL_2 disposed on the substrate SUB. For example, when the second terminal area TL_2 is disposed between one pair of first terminal areas TL_1, the fourth terminal area TL_4 may be disposed between one pair of third terminal areas TL_3. Meanwhile, when the second terminal area TL_2 is disposed at each of the both sides of the first terminal area TL_1, the fourth terminal area TL_4 may be disposed at each of the both sides of the third terminal area TL_3.

Referring to FIGS. 11 and 12, the third terminal area TL_3 is an area corresponding to the first terminal area TL_1 of the substrate SUB and the plurality of first contact terminals PAD_TL_C may be disposed in the third terminal area TL_3. However, in FIGS. 11 and 12, the plurality of first contact pad terminals ROW_PAD_E disposed in the third terminal area TL_3 are described, but the plurality of second contact terminals (not illustrated) disposed in the fourth terminal area TL_4 are also the same as the plurality of first contact terminals PAD_TL_C of FIG. 11.

The plurality of respective first contact terminals PAD_TL_C may be disposed in the same pattern as the first pad terminal PAD_TL_A disposed in the first terminal area TL_1.

Each of the plurality of first contact terminals PAD_TL_C may include the plurality of first contact pad terminals ROW_PAD_E and the plurality of second contact pad terminals ROW_PAD_F.

In the exemplary embodiment, the plurality of first contact pad terminals ROW_PAD_E may be disposed to be spaced apart from each other in one direction. In this case, the plurality of first contact pad terminals ROW_PAD_E may be arranged along the first row R1 having the first inclination angle $\theta 1$ with the first direction (X axis). That is, the plurality of first contact pad terminals ROW_PAD_E may be arranged to be inclined at the same inclination angle as the plurality of first connection pad terminals ROW_PAD_A (see FIG. 5). In this case, the first inclination angle $\theta 1$ may be 0° to 90° (however, 0° and 90° are excluded).

Meanwhile, the intervals of the plurality of adjacent first contact pad terminals ROW_PAD_E may be the same as each other. For example, the interval between the plurality of first contact pad terminals ROW_PAD_E_1 and the plurality of first contact pad terminals ROW_PAD_E_2, the interval between the plurality of first contact pad terminals ROW_PAD_E_2 and the plurality of first contact pad terminals ROW_PAD_E_3, and the interval between the plurality of first contact pad terminals ROW_PAD_E_3 and the plurality of first contact pad terminals ROW_PAD_E_4 may be the same as each other. In this case, the plurality of adjacent first contact pad terminals ROW_PAD_E may be arranged at an interval which is the same as the interval of the first connection pad terminals ROW_PAD_A.

The plurality of first contact pad terminals ROW_PAD_E as an area electrically contacting the first connection pad terminal ROW_PAD_A of the substrate SUB may have the substantially quadrangular shape.

The second contact pad terminal ROW_PAD_F may be disposed to be spaced apart from the first contact pad terminal ROW_PAD_E in the second direction (Y axis).

Similarly to the first contact pad terminals ROW_PAD_E, the second contact pad terminals ROW_PAD_F may also be disposed to be spaced apart from each other in one direction.

In this case, the second contact pad terminals ROW_PAD_F may be arranged along the second row R2 having the second inclination angle $\theta 2$ with the first direction (X axis). That is, the plurality of second contact pad terminals ROW_PAD_F may be arranged to be inclined at the same inclination angle as the plurality of second connection pad terminals ROW_PAD_B (see FIG. 5). In this case, the second inclination angle $\theta 2$ may be 0° to 90° (however, 0° and 90° are excluded).

In the exemplary embodiment, similarly to the arrangement of the first connection pad terminal ROW_PAD_A and the second connection pad terminal ROW_PAD_B of the substrate SUB, the first inclination angle $\theta 1$ and the second inclination angle $\theta 2$ may be the same as each other. Accordingly, both the first contact pad terminal ROW_PAD_E and the second contact pad terminal ROW_PAD_F may be arranged to be inclined at the same angle in the first direction (X axis).

However, the present invention is not limited thereto and the first inclination angle $\theta 1$ and the second inclination angle $\theta 2$ may be different from each other. As a result, the first contact pad terminal ROW_PAD_E and the second contact pad terminal ROW_PAD_F may be arranged to be inclined at different angles in the first direction (X axis).

Meanwhile, the intervals of the adjacent second contact pad terminals ROW_PAD_F may be the same as each other. For example, the interval between the second contact pad terminal ROW_PAD_F_1 and the second contact pad terminal ROW_PAD_F_2, the interval between the second contact pad terminal ROW_PAD_F_2 and the second contact pad terminal ROW_PAD_F_3, and the interval between the second contact pad terminal ROW_PAD_F_3 and the second contact pad terminal ROW_PAD_F_4 may be the same as each other.

The second contact pad terminal ROW_PAD_F as an area electrically contacting the second connection pad terminal ROW_PAD_B of the substrate SUB may have the substantially quadrangular shape.

The quadrangle forming the shape of each of the first contact pad terminal ROW_PAD_E and the second contact pad terminal ROW_PAD_F may include a first side L1 parallel to the first direction (X axis) and a second side L2 parallel to the second direction (Y axis). Herein, the first side L1 and the second side L2 may be neighboring to each other.

In this case, in the quadrangle, the second side L2 may be formed to be longer than the first side L1 (L1<L2). That is, the quadrangle may be a rectangular shape which elongates in the second direction (Y axis). However, the present invention is not limited thereto and the first side L1 and the second side L2 may be the same as each other. That is, the quadrangle may include the square.

According to the exemplary embodiment, when each of the first contact pad terminal ROW_PAD_E and the second contact pad terminal ROW_PAD_F forms the rectangular shape which elongates in the second direction, the interval between the first contact pad terminals ROW_PAD_E or the second contact pad terminals ROW_PAD_F in the first direction (X axis) may be reduced.

Accordingly, the number of first contact pad terminals ROW_PAD_E and second contact pad terminals ROW_PAD_F disposed in the third terminal area TL_3 may be increased.

Meanwhile, in the exemplary embodiment, an area S1 of the first contact pad terminal ROW_PAD_E may be larger than an area S2 of the second contact pad terminal ROW_PAD_F (S1>S2). The area S1 of the first contact pad terminal ROW_PAD_E arranged on the first row R1 may be larger than the area A2 of the second contact pad terminal ROW_PAD_F arranged on the second row R2.

In the exemplary embodiment, an area of the first contact pad terminal ROW_PAD_E which overlaps with the first contact hole CT_1 may be larger than the area of the second contact pad terminal ROW_PAD_F which does not overlap with the first contact hole CT_1. Herein, the areas S1 and S2 of the first contact pad terminal ROW_PAD_E and the second contact pad terminal ROW_PAD_F represent the areas of the first contact pad terminal ROW_PAD_E and the second contact pad terminal ROW_PAD_F exposed by a second protective layer SR2. For easy description, in FIG. 12, width direction S1 of the first contact pad terminal ROW_PAD_E_1 and width direction S2 of the second contact pad terminal ROW_PAD_F_1 are written as the areas.

According to the exemplary embodiment, the area of the first contact pad terminal ROW_PAD_E is disposed to be larger than the area of the second contact pad terminal ROW_PAD_F to maintain an actual contact area of the first contact pad terminal ROW_PAD_E contacting the first connection pad terminal ROW_PAD_A (see FIG. 5) and an actual contact area of the second contact pad terminal ROW_PAD_F contacting the second connection pad terminal ROW_PAD_B (see FIG. 5) to be the same as each other. Herein, the actual contact areas represent areas of the first contact pad terminal ROW_PAD_E and the second contact pad terminal ROW_PAD_F contacting the first connection pad terminal ROW_PAD_A_1 (see FIG. 15) and the second connection pad terminal ROW_PAD_B_1 (see FIG. 15), respectively through the conductive ball CNB (see FIG. 15). Hereinafter, the areas will be described in more detail with reference to FIG. 13.

Figure 13:
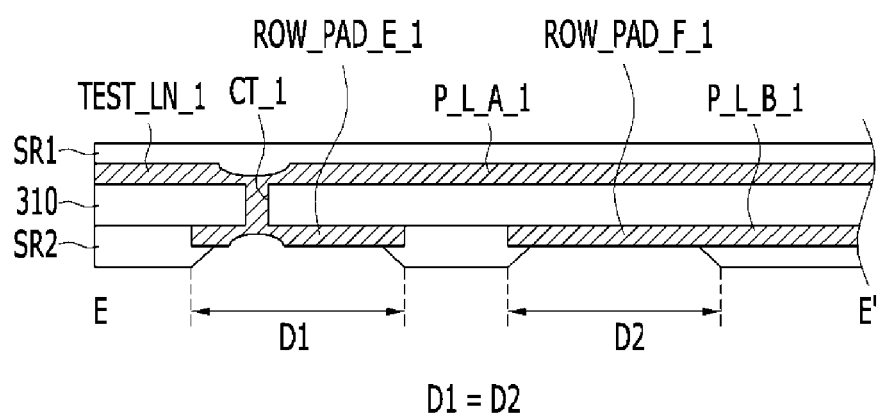
FIG. 13 is a schematic cross-sectional view of a comparative example in which first and second contact pad terminals have the same area.

FIG. 13 is a schematic cross-sectional view of a comparative example in which first and second contact pad terminals have the same area.

Referring to FIG. 13, a first terminal line P_L_A_1 and the first contact pad terminal ROW_PAD_E_1 may be made of the same metal in the printed circuit board 300. In this case, during forming the first terminal line P_L_A_1 and the first contact pad terminal ROW_PAD_E_1, dimples may be formed on the first terminal line P_L_A_1 and the first contact pad terminal ROW_PAD_E_1 positioned at the upper side and the lower side of the first contact hole CT_1. In detail, the surface of the first terminal line P_L_A_1 may be concave toward the first contact hole CT_1 and the surface of the first contact pad terminal ROW_PAD_E_1 may be concave toward the first contact hole CT_1.

Therefore, an area of the first contact pad terminal ROW_PAD_E_1 actually contacting the first connection pad terminal ROW_PAD_A_1 (see FIG. 15) through the conductive ball CNB (see FIG. 15) is reduced. That is, even though an area D1 of the first contact pad terminal ROW_PAD_E_1 and an area D2 of the second contact pad terminal ROW_PAD_F_1 are disposed to be the same as each other, the actual contact area of the first contact pad terminal ROW_PAD_E_1 may be reduced by the dimple formed on the surface of the first contact pad terminal ROW_PAD_E_1.

In this case, the actual contact area of the first contact pad terminal ROW_PAD_E_1 may corresponding to a difference between the area D1 of the first contact pad terminal ROW_PAD_E_1 and the area of the dimple. For example, the area of the dimple formed on the surface of the first contact pad terminal ROW_PAD_E_1 may be approximately 6.4% of the area D1 of the first contact pad terminal ROW_PAD_E_1. Accordingly, the actual contact area of the first contact pad terminal ROW_PAD_E_1 may corresponding to an area reduced from the area D1 of the first contact pad terminal ROW_PAD_E_1 by 6.4%.

That is, in the exemplary embodiment, the dimension of the first contact pad terminal ROW_PAD_E_1 is increased as large as a reduction amount of the area by the dimple in order to prevent the actual contact area of the first contact pad terminal ROW_PAD_E_1 from being reduced by the dimple. In this case, a ratio of the area S2 of the second contact pad terminal ROW_PAD_E_1 and the area S1 of the first contact pad terminal ROW_PAD_E_1 may be approximately 1:1.06 or more.

Referring back to FIGS. 11 and 12, the first terminal line P_L_A_1 and a second terminal line P_L_B_1 may be positioned at both sides, that is, the upper side and the lower side of the base film 310 on the printed circuit substrate SUB. The first terminal line P_L_A_1 is positioned above the base film 310 and the second terminal line P_L_B_1 may be positioned below the base film 310. In this case, each of the first terminal line P_L_A_1 and the second terminal line P_L_B_1 may be electrically connected with the driving chip 350.

A first protective layer SR1 may be disposed above the first terminal line P_L_A_1 and a second protective layer SR2 may be disposed below the second terminal line P_L_B_1. In this case, the first protective layer SR1 and the second protective layer SR2 may be solder resist.

The first contact pad terminal ROW_PAD_E_1 and the second contact pad terminal ROW_PAD_F_1 may be formed as the same layer as the second terminal line P_L_B_1. The first contact pad terminal ROW_PAD_E_1 and the second contact pad terminal ROW_PAD_F_1 may be formed by exposing a part of the second terminal line P_L_B_1 as a part of the second protective layer SR2 is removed. In this case, the first contact pad terminal ROW_PAD_E_1 and the second contact pad terminal ROW_PAD_F_1 are spaced apart from each other.

The first contact pad terminal ROW_PAD_E_1 may be electrically connected with the first terminal line P_L_A_1 through the first contact hole CT_1 formed in the base film 310. When viewed on a plane, the first contact hole CT_1 may be disposed to overlap with the first contact pad terminal ROW_PAD_E_1. In this case, the first contact hole CT_1 may be filled with the same metal as the first terminal line P_L_A_1 or metal configuring the first contact pad terminal ROW_PAD_E_1.

Meanwhile, the second contact pad terminal ROW_PAD_F_1 may be made of the same metallic layer as the second terminal line P_L_B_1. In the exemplary embodiment, the second contact pad terminal ROW_PAD_F_1 may correspond to a region where a part of the second terminal line P_L_B_1 is exposed.

In the exemplary embodiment, a first test line TEST_LN may be connected to the first contact pad terminal ROW_PAD_E.

In this case, the first test line TEST_LN may extend upward in the second direction (Y axis). In the exemplary embodiment, the first test line TEST_LN may extend up to the upper end of the base film 310. Before the printed circuit board 300 is attached to the substrate SUB, a first test pad terminal TEST_PAD_A may be positioned on the end of the first test line TEST_LN. That is, a first test pad part TEST_PAD_1 constituted by the first test line TEST_LN and the first test pad terminal TEST_PAD_A is positioned on the printed circuit board 300. For example, the first test pad terminal TEST_PAD may be positioned on the end of the first test line TEST_LN.

However, since the first test pad terminal TEST_PAD_A is separated when the substrate SUB is attached to the printed circuit board 300, only a part of the first test line TEST_LN remains on the printed circuit board 300 attached to the substrate SUB.

Meanwhile, the first test line TEST_LN_1 may be electrically connected with the first contact pad terminal ROW_PAD_E_1 through the first contact hole CT_1. Further, the first test line TEST_LN_1 may be formed as the same layer as the first terminal line P_L_A_1.

Hereinafter, a state in which the first pad terminal PAD_TL_A and the first contact terminal PAD_TL_C are coupled to each other will be described in detail with reference to FIGS. 14 and 15.

Figure 14:
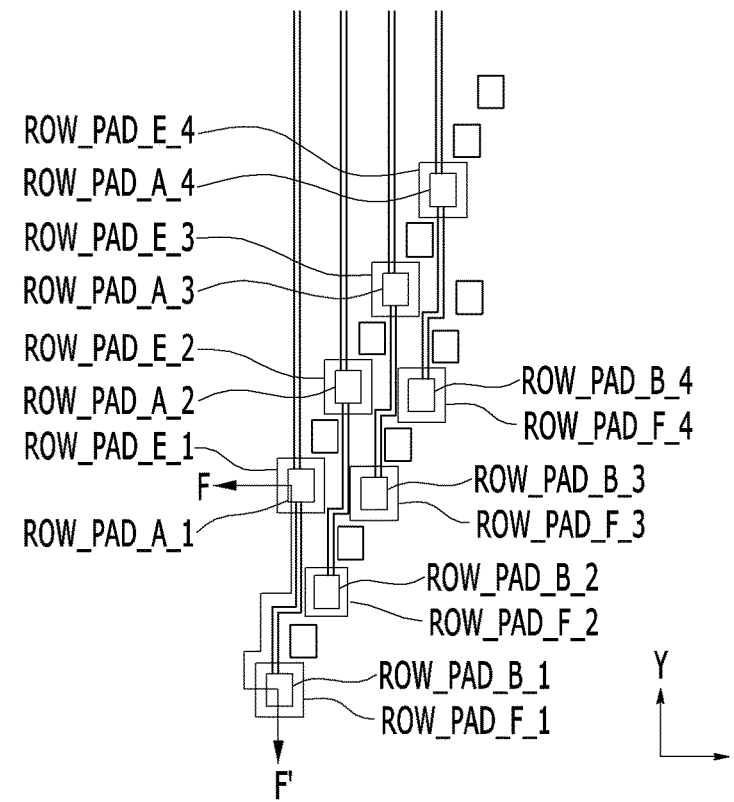
FIG. 14 is a diagram schematically illustrating a state in which first pad terminals formed on a display substrate and first contact terminals formed on the printed circuit board are coupled to each other.
Figure 15:
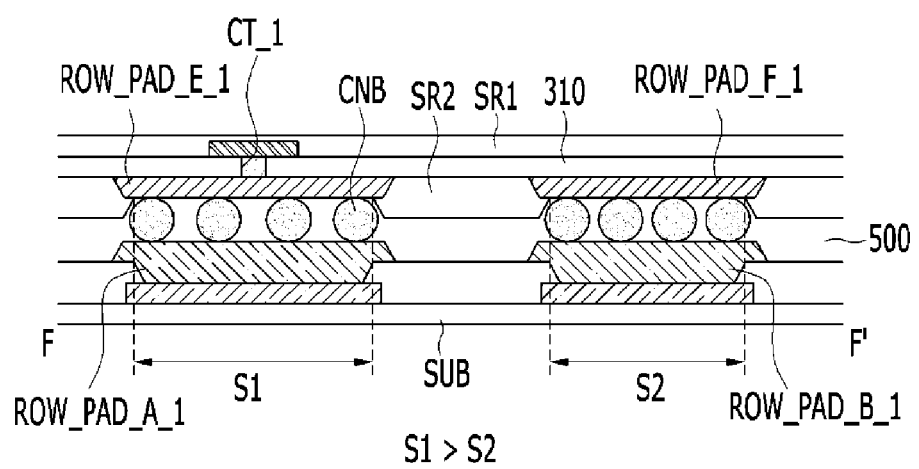
FIG. 15 is a cross-sectional view taken along line F-F' of FIG. 14.

FIG. 14 is a diagram schematically illustrating a state in which first pad terminals formed on a display substrate and first contact terminals formed on the printed circuit board are coupled to each other and FIG. 15 is a cross-sectional view taken along line F-F' of FIG. 14.

The first contact terminal PAD_TL_C (see FIG. 11) may be disposed to overlap on the first pad terminal PAD_TL_A (see FIG. 5). In more detail, the first contact pad terminal ROW_PAD_E may be disposed to overlap on the first connection pad terminal ROW_PAD_A and the second contact pad terminal ROW_PAD_F may be disposed to overlap on the second connection pad terminal ROW_PAD_B.

In the exemplary embodiment, when viewed on the plane, the first contact hole CT_1, the first contact pad terminal ROW_PAD_E, and the first connection pad terminal ROW_PAD_A may be sequentially disposed to overlap with each other. That is, the first contact pad terminal ROW_PAD_E and the first contact hole CT_1 may be disposed to overlap with each other on the first connection pad terminal ROW_PAD_A arranged along the first row R1.

In addition, a conductive adhesive film 500 may be disposed between the first pad terminal PAD_TL_A (see FIG. 5) and the first contact terminal PAD_TL_C (see FIG. 11). The conductive adhesive film 500 may electrically connect the first connection pad terminal ROW_PAD_A and the first contact pad terminal ROW_PAD_E. The first connection pad terminal ROW_PAD_A and the first contact pad terminal ROW_PAD_E may be electrically connected with each other through a plurality of conductive balls CNB included in the conductive adhesive film 500.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
a display substrate comprising a display area configured to display an image and a pad area positioned on a periphery of the display area;
a first pad part positioned above the pad area and comprising a plurality of first pad terminals arranged in a first direction; and
a printed circuit board comprising a base film and a second pad part positioned at one side of the base film and coupled with the first pad part,
wherein the second pad part comprises a plurality of first contact terminals coupled with the plurality of first pad terminals,
wherein each of the plurality of first contact terminals further comprises:
a plurality of first contact pad terminals arranged along a first row forming a first inclination angle with the first direction, and
a plurality of second contact pad terminals spaced apart from the plurality of first contact pad terminals and arranged along a second row forming a second inclination angle with the first direction, and
wherein each of the plurality of first contact pad terminal has a first area and each of the plurality of second contact pad terminal has a second area that is different from the first area.

2. The display device of claim 1, wherein:
the printed circuit board further comprises a first terminal line disposed on the base film, and
the first terminal line is electrically connected with the plurality of first contact pad terminals disposed below the base film through the base film, wherein the first terminal line, the plurality of first contact pad terminals coupled with the base film defines a first contact hole penetrating the base film.

3. The display device of claim 2, wherein the first contact hole overlaps with the plurality of first contact pad terminals.

4. The display device of claim 3, wherein the first area is larger than the second area.

5. The display device of claim 4, wherein a ratio of the second area to the first area is 1:1.06 or more.

6. The display device of claim 2, wherein the printed circuit board further comprises a plurality of first test lines, the plurality of first test lines are connected to the first terminal line and extend up to one end of the base film.

7. The display device of claim 1, wherein:
each of the plurality of first contact pad terminals has a quadrangular shape.

8. The display device of claim 7, wherein:
each of the plurality of first contact pad terminals further comprises a first side parallel to the first direction and a second side neighboring to the first side and parallel to a second direction crossing the first direction, and
a length of the second side is greater than or equal to a length of the first side.

9. The display device of claim 7, wherein:
the plurality of first contact pad terminals further comprise a first side parallel to the first direction and a second side neighboring to the first side and parallel to a second direction crossing the first direction, and
the length of the second side is longer than the length of the first side.

10. The display device of claim 1, wherein:
the first inclination angle and the second inclination angle are the same as each other.

11. The display device of claim 10, wherein: the first inclination angle and the second inclination angle are larger than 0° and less than 90°.

12. The display device of claim 1, wherein:
each of the plurality of first pad terminals further comprises:
a plurality of first connection pad terminals respectively facing the plurality of first contact pad terminals, and arranged along the first row, and
a plurality of second connection pad terminals respectively facing the plurality of second contact pad terminals, and arranged along the second row.

13. The display device of claim 12, wherein:
the first area is larger than the second area.

14. The display device of claim 12, wherein:
each of the plurality of first pad terminals further comprises a plurality of first terminal connection lines connecting one of the plurality of first connection pad terminals to one of the plurality of second connection pad terminals and having a shape in which the plurality of first terminal connection lines are bent once or more.

15. The display device of claim 14, wherein:
each of the plurality of first pad terminals further comprises a first dummy pad terminal disposed between one pair of adjacent first connection pad terminals, among the plurality of first connection pad terminals, along the first row.

16. The display device of claim 15, wherein:
each of the plurality of first pad terminals further comprises a second dummy pad terminal disposed between one pair of adjacent second connection pad terminals, among the plurality of second connection pad terminals, along the second row.

17. The display device of claim 1, wherein:
the first pad part further comprises a plurality of second pad terminals disposed in a second terminal area spaced apart from a first terminal area where the plurality of first pad terminals are disposed.

18. The display device of claim 17, wherein:
each of the plurality of second pad terminals further comprises:
a plurality of third connection pad terminals arranged along a third row having a third inclination angle with the first direction, and
a plurality of fourth connection pad terminals spaced apart from the plurality of third connection pad terminals and arranged along a fourth row having a fourth inclination angle with the first direction.

19. The display device of claim 18, wherein:
the second pad part of the printed circuit board further comprises a plurality of second contact terminals disposed in a fourth terminal area spaced apart from a third terminal area where the plurality of first contact terminals are disposed.

20. The display device of claim 19, wherein:
each of the plurality of second contact terminals further comprises:
a plurality of third contact pad terminals respectively facing the plurality of third connection pad terminals, and arranged along the third row, and
a plurality of fourth contact pad terminals respectively facing the plurality of fourth connection pad terminals, and arranged along the fourth row.

21. A printed circuit board comprising:
a base film;
a second pad part positioned below the base film and comprising a plurality of first contact terminals arranged in a first direction; and
a first terminal line disposed on the base film,
wherein each of the plurality of first contact terminals comprises:
a plurality of first contact pad terminals arranged along a first row forming a first inclination angle with the first direction, the plurality of first contact pad terminals are electrically connected with the first terminal line through the base film, wherein the first terminal line, the plurality of first contact pad terminals coupled with the base film defines a first contact hole penetrating the base film, and the plurality of first contact pad terminals overlap with the first contact hole, and
a plurality of second contact pad terminals spaced apart from the plurality of first contact pad terminals and arranged along a second row having a second inclination angle with the first direction, and
each of the plurality of first contact pad terminals has a first area and each of the plurality of second contact pad terminals has a second area that is different from the first area.

22. The printed circuit board of claim 21, wherein:
the first area is larger than the second area.

23. The printed circuit board of claim 21, further comprising:
a plurality of first test lines which are connected to the first terminal line and extend up to one end of the base film.

24. The printed circuit board of claim 21, wherein:
each of the plurality of first contact pad terminals has a quadrangular shape.

25. The printed circuit board of claim 24, wherein:
each of the plurality of first contact pad terminals further comprises a first side parallel to the first direction and a second side neighboring to the first side and parallel to a second direction crossing the first direction, and
a length of the second side is greater than or equal to a length of a first side.

26. The printed circuit board of claim 24, wherein:
each of the plurality of first contact pad terminals further comprises a first side parallel to the first direction and a second side neighboring to the first side and parallel to a second direction crossing the first direction, and
the length of the second side is longer than the length of the first side.

* * * * *